(12) United States Patent
Lee

(10) Patent No.: US 11,282,984 B2
(45) Date of Patent: Mar. 22, 2022

(54) LIGHT EMITTING DEVICE

(71) Applicant: SEOUL VIOSYS CO., LTD., Ansan-si (KR)

(72) Inventor: Chung Hoon Lee, Ansan-si (KR)

(73) Assignee: Seoul Viosys Co., Ltd., Ansan-si (KR)

(*) Notice: Subject to any disclaimer, the term of this patent is extended or adjusted under 35 U.S.C. 154(b) by 0 days.

(21) Appl. No.: 16/589,593

(22) Filed: Oct. 1, 2019

(65) Prior Publication Data
US 2020/0111936 A1    Apr. 9, 2020

Related U.S. Application Data

(60) Provisional application No. 62/741,924, filed on Oct. 5, 2018.

(51) Int. Cl.
*H01L 33/44* (2010.01)
*H01L 27/15* (2006.01)
*H01L 33/08* (2010.01)
*H01L 33/38* (2010.01)
*H01L 33/62* (2010.01)

(52) U.S. Cl.
CPC ............ *H01L 33/44* (2013.01); *H01L 27/156* (2013.01); *H01L 33/08* (2013.01); *H01L 33/382* (2013.01); *H01L 33/62* (2013.01)

(58) Field of Classification Search
CPC ..... H01L 27/156; H01L 33/08; H01L 33/382; H01L 33/44; H01L 33/62
See application file for complete search history.

(56) References Cited

U.S. PATENT DOCUMENTS

| | | | |
|---|---|---|---|
| 8,829,540 B2 * | 9/2014 | Kim | H01L 27/156 |
| | | | 257/88 |
| 9,269,745 B2 * | 2/2016 | Kim | H01L 33/22 |
| 9,356,212 B2 * | 5/2016 | Oh | H01L 27/156 |
| 9,673,254 B2 * | 6/2017 | Oh | H01L 27/156 |
| 10,903,394 B2 * | 1/2021 | Sunda | H01L 27/156 |
| 2009/0025780 A1 * | 1/2009 | Nakata | H01L 33/20 |
| | | | 136/250 |
| 2009/0078955 A1 | 3/2009 | Fan et al. | |
| 2011/0204387 A1 * | 8/2011 | Kim | H01L 27/156 |
| | | | 257/88 |
| 2013/0228793 A1 | 9/2013 | Kim et al. | |

(Continued)

FOREIGN PATENT DOCUMENTS

| | | |
|---|---|---|
| JP | H07-263752 | 10/1995 |
| KR | 10-2011-0095772 | 8/2011 |
| KR | 10-2017-0082889 | 7/2017 |

OTHER PUBLICATIONS

International Search Report dated Jan. 21, 2020, in International Patent Application PCT/KR2019/012952.

*Primary Examiner* — Mohammed Shamsuzzaman
(74) *Attorney, Agent, or Firm* — H.C. Park & Associates, PLC

(57) ABSTRACT

A light emitting device including a substrate having a first surface and a second surface opposing the first surface, at least one of the first and second surfaces having a concave part extending to the inside of the substrate, a plurality of light emitting cells disposed on the first surface of the substrate, and a light shielding layer filling at least a portion of the concave part and disposed between the plurality of light emitting cells.

12 Claims, 44 Drawing Sheets

(56) References Cited

U.S. PATENT DOCUMENTS

| | | | |
|---|---|---|---|
| 2016/0161326 A1* | 6/2016 | Chang | G01H 9/004 |
| | | | 250/227.14 |
| 2017/0263828 A1* | 9/2017 | Mao | H01L 33/62 |
| 2018/0045866 A1* | 2/2018 | Chae | G02F 1/133553 |
| 2018/0088261 A1* | 3/2018 | Song | G02B 5/206 |

* cited by examiner

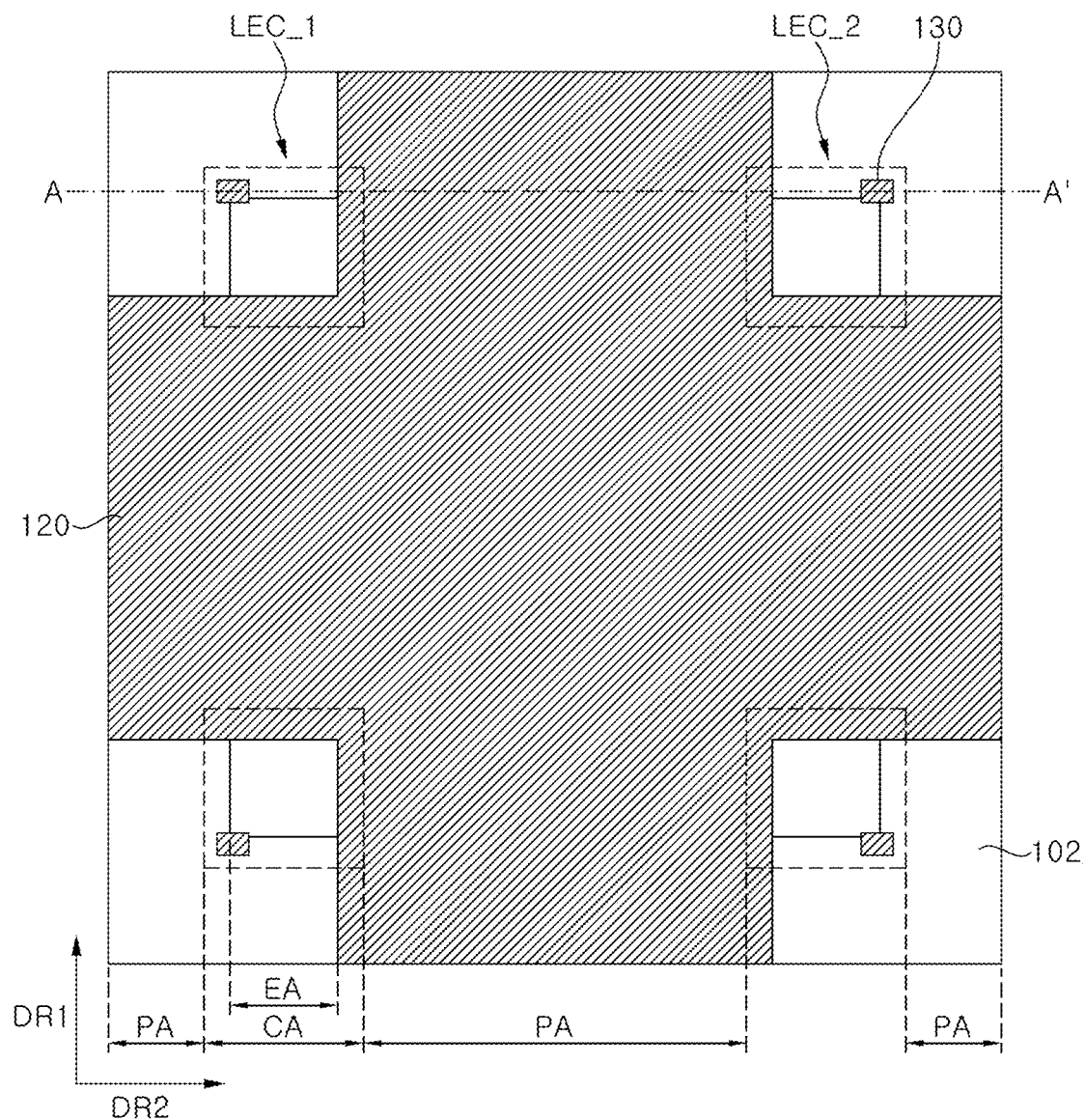

LIGHT EMITTING DEVICE

CROSS-REFERENCE TO RELATED APPLICATIONS

This application claims priority from and the benefit of U.S. Provisional Patent Application No. 62/741,924, filed on Oct. 5, 2018, which is hereby incorporated by reference for all purposes as if fully set forth herein.

BACKGROUND

Field

Exemplary embodiments of the present disclosure relate to a light emitting device, and more particularly, to a light emitting device including a plurality of light emitting cells.

Discussion of the Background

Light emitting diodes are widely used as inorganic light sources in various fields, such as display devices, vehicle lamps and general lighting. Light emitting diodes are rapidly replacing existing light sources due to their longer lifetime, lower power consumption, and faster response speed over conventional light sources.

As recently light emitting diodes are being developed to have light weight, thinness, compactness, and miniaturization, so as to be used as backlight sources of various display devices, such as a mobile phone, a color mixing may occur between neighboring light emitting cells.

The above information disclosed in this Background section is only for understanding of the background of the inventive concepts, and, therefore, it may contain information that does not constitute prior art.

SUMMARY

Light emitting devices constructed according to exemplary embodiments of the invention are capable of preventing color mixing to provide excellent color reproducibility.

Additional features of the inventive concepts will be set forth in the description which follows, and in part will be apparent from the description, or may be learned by practice of the inventive concepts.

A light emitting device according to an exemplary embodiment includes a substrate having a first surface and a second surface opposing the first surface, at least one of the first and second surfaces having a concave part extending to the inside of the substrate, a plurality of light emitting cells disposed on the first surface of the substrate, and a light shielding layer filling at least a portion of the concave part and disposed between the plurality of light emitting cells.

At least one of the light emitting cells may have a first light emitting part, a second light emitting part, and a third light emitting part vertically stacked one over another.

The light emitting device may further include a common pad, a first pad, a second pad, and a third pad disposed on the at least one light emitting cell, in which the common pad may be electrically connected to the first, second, and third light emitting parts in common, and the first, second, and third pads may be electrically connected to the first, second, and third light emitting parts, respectively.

The light shielding layer may include at least one of Ti, Ni, Al, Ag, Cr, a photoresist, epoxy, PDMS, and a black matrix.

The light shielding layer may be disposed on the first surface of the substrate, and the light shielding layer may be disposed between the light emitting cells on the first surface of the substrate, and has a top surface coplanar with a top surface of each of the light emitting cells.

The light emitting device may further include pads disposed on the light shielding layer and electrically coupled with the light emitting cells, respectively.

The light emitting device may further include an insulating layer disposed on the light shielding layer, through electrodes passing through the insulating layer and the light shielding layer, and electrically coupled with the light emitting cells, respectively, and pads disposed on the insulating layer and electrically coupled with the through electrodes.

The concave part may include a first concave part extending from the first surface of the substrate to the inside of the substrate, and a second concave part extending from the second surface of the substrate to the inside of the substrate, and the light shielding layer may include a first light shielding layer filling at least a portion of the first concave part and a second light shielding layer filling at least a portion of the second concave part.

One end of the first light shielding layer and one end of the second light shielding layer may overlap with each other.

The first light shielding layer may include a vertical part extending along a first direction and a horizontal part extending along a second direction crossing the first direction, and the second light shielding layer may include a plurality of vertical parts extending along the first direction and parallel to each other, and a plurality of horizontal parts extending along the second direction.

The vertical part of the first light shielding layer may be disposed between the vertical parts of the second light shielding layer, and the horizontal part of the first light shielding layer may be disposed between the horizontal parts of the second light shielding layer.

The substrate may include cell areas in which the plurality of light emitting cells are disposed, and a peripheral area adjacent to the cell areas, the cell areas may include light emitting areas defined by the first light shielding layer and the second light shielding layer, respectively, and each light emitting area may be smaller than each cell area.

Portions of the substrate corresponding to the light emitting areas may have a surface roughness.

The light emitting device may further include through electrodes passing through the substrate and electrically coupling the light shielding layer and the light emitting cells, in which the light shielding layer may be disposed on the second surface of the substrate.

The light shielding layer may include at least one of Ti, Ni, Al, Ag, and Cr.

The light emitting device may further include a pad disposed between the first surface of the substrate and the light emitting cells, and electrically coupled with the light emitting cells.

The substrate may include cell areas in which the plurality of light emitting cells are disposed, and a peripheral area adjacent to the cell areas, the cell areas may include light emitting areas defined by the light shielding layer, respectively, and each light emitting area may be smaller than each cell area.

Portions of the substrate corresponding to the light emitting areas may have a surface roughness.

The concave part may have at least one of substantially a V-shaped structure, substantially a polygonal structure in which the first surface or the second surface of the substrate is opened, and substantially a U-shaped structure.

The light shielding layer may fill at least a portion of the concave part and extends to the first surface or the second surface of the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIGS. 9A and 9B are schematic top views of a light emitting device according to another exemplary embodiment.

DETAILED DESCRIPTION

Figure 1A:
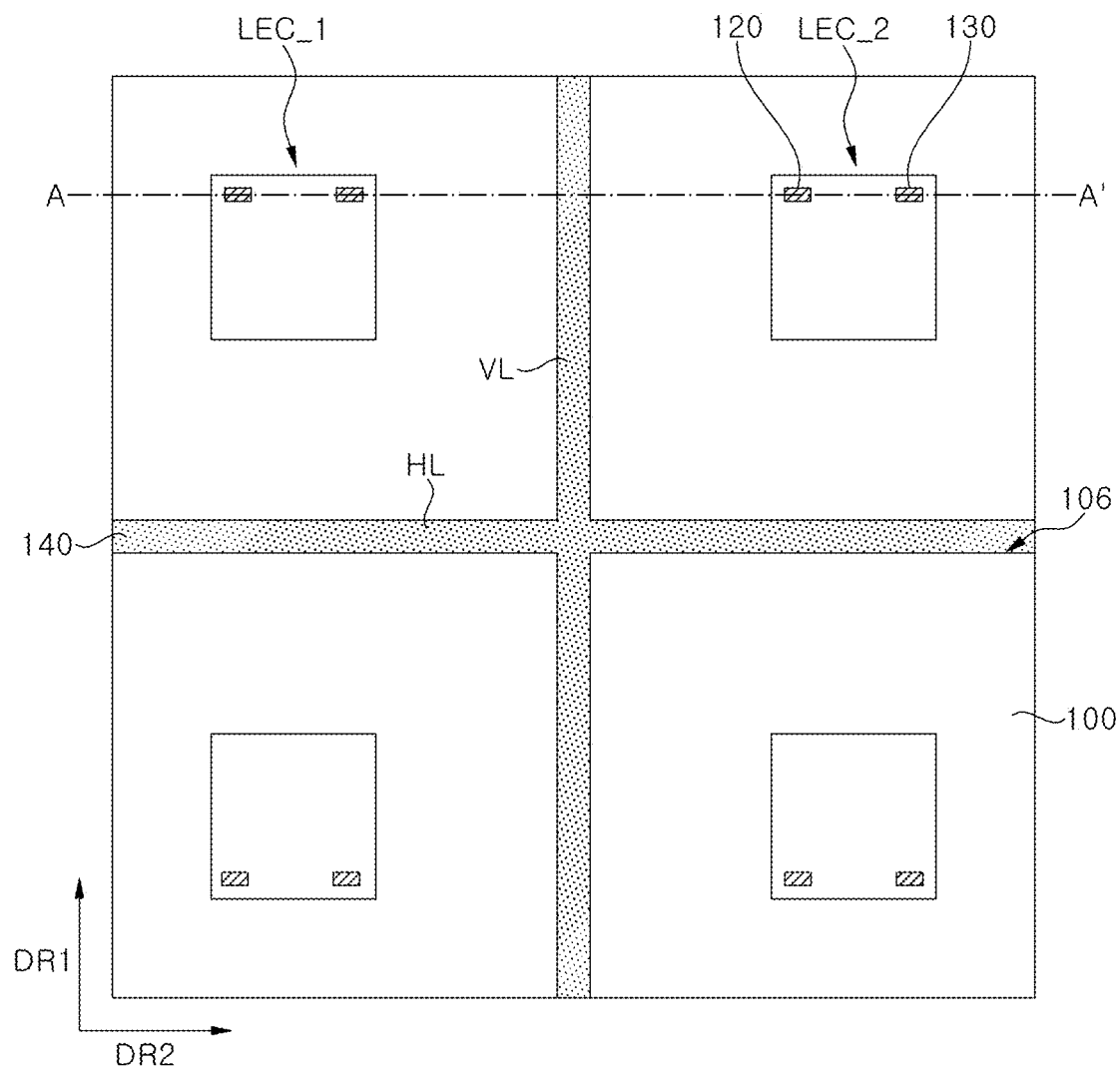
FIG. 1A is a schematic top view of a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, a light emitting device will be described below with reference to the accompanying drawings through various exemplary embodiments.

Figure 1B:
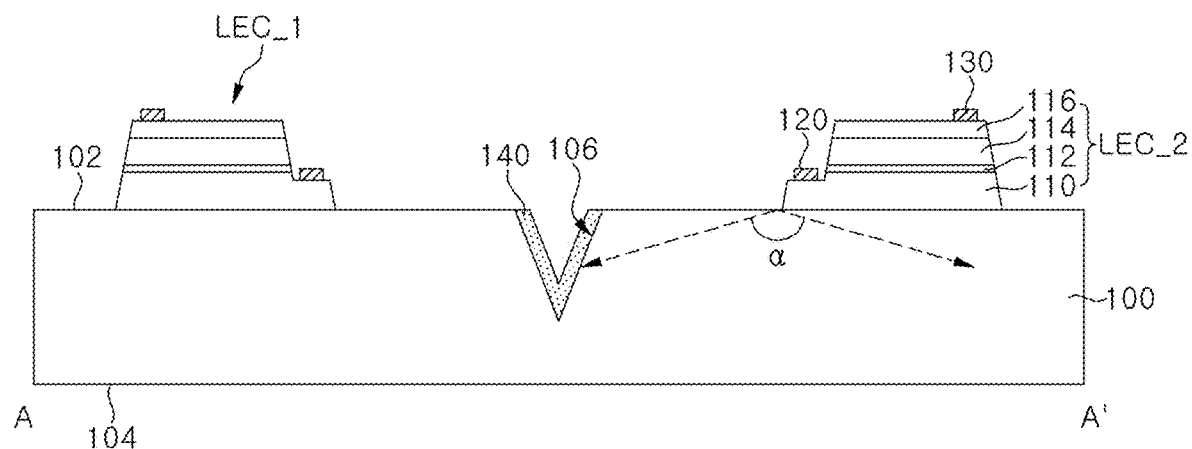
FIG. 1B is a cross-sectional view taken along line A-A' of FIG. 1A.
Figure 1C:
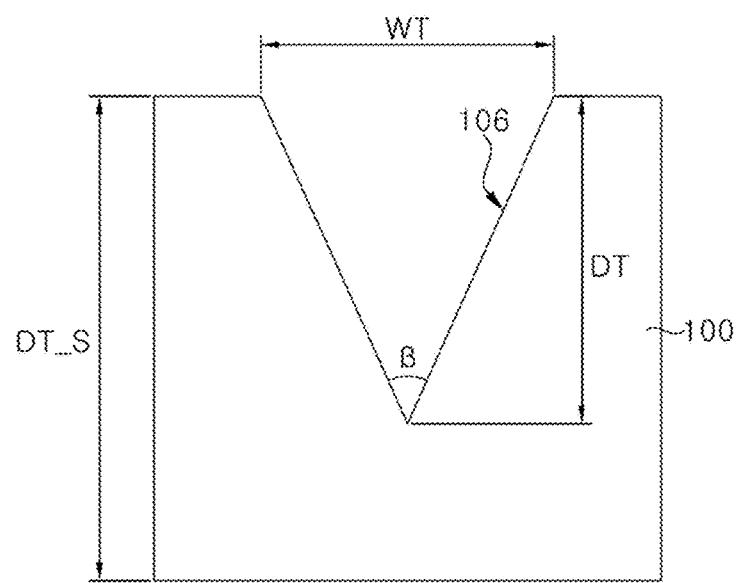
FIG. 1C is an enlarged view of the concave part of the light emitting device of FIG. 1A.

FIG. 1A is a schematic top view of a light emitting device according to an exemplary embodiment, and FIG. 1B is a cross-sectional view taken along line A-A' of FIG. 1A. FIG. 1C is an enlarged view of the concave part 106 of the light emitting device illustrated in FIG. 1B, and FIGS. 1D to 1F are modifications of the concave part 106 of FIG. 1C according to exemplary embodiments.

Referring to FIGS. 1A to 1C, a light emitting device may include a substrate 100 and a plurality of light emitting cells LEC_1 and LEC_2 disposed on the substrate 100.

The substrate 100 may be capable of growing a gallium nitride-based semiconductor layer thereon, and may include a sapphire ($Al_2O_3$), a silicon carbide (SiC), a gallium nitride (GaN), an indium gallium nitride (InGaN), an aluminum gallium nitride (AlGaN), an aluminum nitride (AlN), a gallium oxide ($Ga_2O_3$), a gallium arsenic (GaAs), or silicon (Si). In some exemplary embodiments, the substrate 100 may be flexible, or include a circuit therein.

The substrate 100 may have a first surface 102, on which the light emitting cells LEC_1 and LEC_2 are disposed, and a second surface 104 opposing the first surface 102. The second surface 204 of the substrate 100 may be a light emitting surface of light generated from the light emitting cells LEC_1 and LEC_2.

According to an exemplary embodiment, the substrate 100 may have a thickness as thin as possible. This is because the substrate 100 may function as a light guide plate, through which light generated from the light emitting cells LEC_1 and LEC_2 may be guided. As such, in order to prevent the substrate 100 functioning as a light guide plate, the substrate 100 may have a thickness as thin as possible. For example, the substrate 100 may have a thickness of about 80 μm to about 200 μm.

By etching the substrate 100, the first surface 102 of the substrate 100 may be formed with a concave part 106, which extends from the first surface 102 to the inside of the substrate 100. The concave part 106 may include a vertical part VL extending in a first direction DR1, and a horizontal part HL extending in a second direction DR2 intersecting the first direction DR1. For example, the vertical part VL and the horizontal part HL may cross with each other.

Referring to FIG. 1C, the concave part 106 may have substantially a V-shaped structure, which has two sides converging from the first surface 102 of the substrate 100 to a point inside the substrate 100. The depth DT of the concave part 106 may be about ⅓ to about ⅔ of the thickness DT_S of the substrate 100. For example, when the substrate 100 has the thickness DT_S of 80 μm to 100 μm, the concave part 106 may have the depth DT of 25 μm to 70 μm. The longest width WT between the two sides of the concave part 106 may be about 20 μm to about 30 μm. The angle β between the two sides of the concave part 106 may be about 40 to about 80 degrees.

Figure 1D:
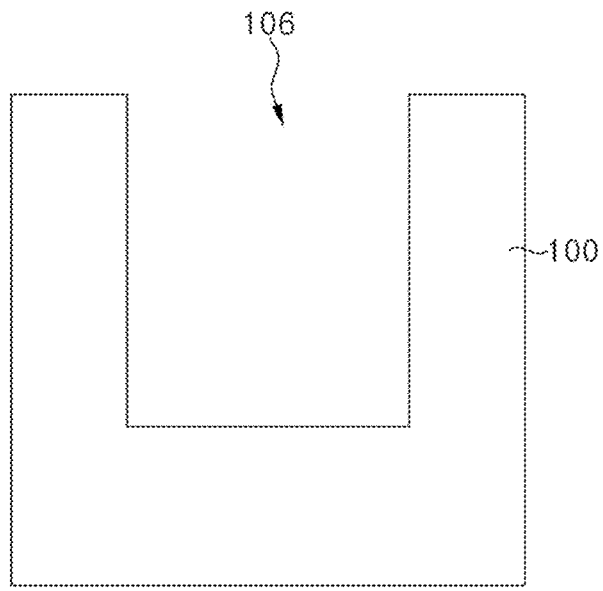
FIGS. 1D, 1E, and 1F are enlarged views of the concave part of the light emitting device according to exemplary embodiments.
Figure 1E:
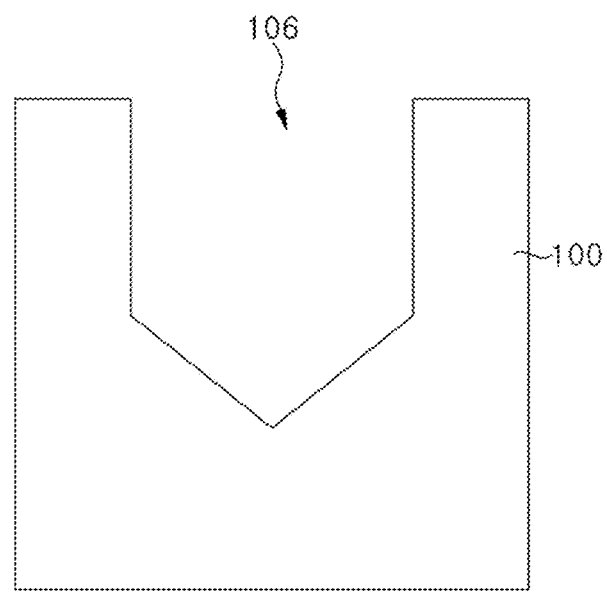
Figure 1F:
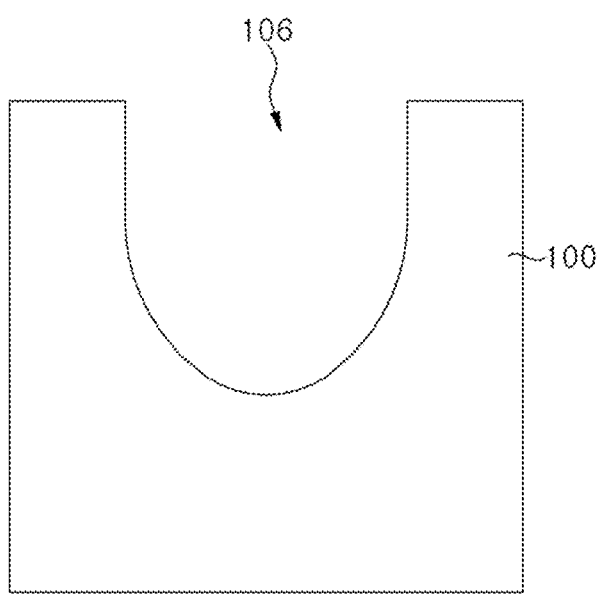

The inventive concepts are not limited to one particular shape of the concave part 106, and in some exemplary embodiments, the concave part 106 may have various structures other than the substantially V-shaped structure. Referring to FIG. 1D, the concave part 106 according to another exemplary embodiment may include two vertical surfaces, which extend from the first surface 102 of the substrate 100 to the inside of the substrate 100 and are parallel to each other, and a horizontal surface connecting the vertical surfaces. In a cross-sectional view, the concave part 106 may have substantially an open square structure, in which a side corresponding to the first surface 102 of the substrate 100 is opened. Referring to FIG. 1E, the concave part 106 according to another exemplary embodiment may include two vertical surfaces, which extend from the first surface 102 of the substrate 100 to the inside of the substrate 100 and are parallel to each other, and two surfaces converging into a point between the two vertical surfaces. In a cross-sectional view, the concave part 106 may have substantially an open pentagon structure, in which a side corresponding to the first surface 102 of the substrate 100 is opened. Referring to FIG. 1F, the concave part 106 according to another exemplary embodiment may extend from the first surface 102 of the substrate 100 to the inside of the substrate 100, and have a curved surface. In a cross-sectional view, the concave part 106 may have substantially a U-shaped structure. It is to be noted that, however, the inventive concepts are not limited to one particular shape of the concave part 106, and in some exemplary embodiments, the concave part 106 may have various structures other than those described above.

Referring back to FIGS. 1A and 1B, a light shielding layer 140 may be disposed at least in a portion of the concave part 106. Between the two neighboring light emitting cells LEC_1 and LEC_2, for example, a first light emitting cell LEC_1 and a second light emitting cell LEC_2, the light shielding layer 140 may reflect light generated in the first light emitting cell LEC_1 toward the first light emitting cell LEC_1, or shield or absorb light generated in the first light emitting cell LEC_1, such that light generated in the first light emitting cell LEC_1 does not exert an influence on the second light emitting cell LEC_2. Similarly, the light shielding layer 140 may reflect light generated in the second light emitting cell LEC_2 toward the second light emitting cell LEC_2, or shield or absorb light generated in the second light emitting cell LEC_2, such that light generated in the second light emitting cell LEC_2 does not exert an influence on the first light emitting cell LEC_1. For example, the light shielding layer 140 may include metal, such as Ti, Ni, Al, Ag and Cr, or may include a material, such as a photoresist, epoxy, PDMS (polydimethylsiloxane), and a black matrix.

Hereinafter, the structure of the light shielding layer 140 will be described as being formed in the concave part 106 illustrated in FIG. 1C.

FIGS. 2A to 2D are cross-sectional views illustrating the structures of light shielding layers according to exemplary embodiments.

Figure 2A:
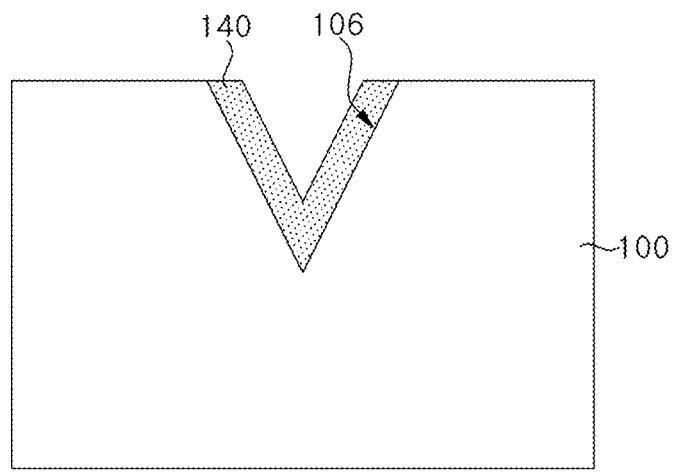
FIGS. 2A, 2B, 2C, and 2D are cross-sectional views of the light shielding layers according to an exemplary embodiment.
Figure 2B:
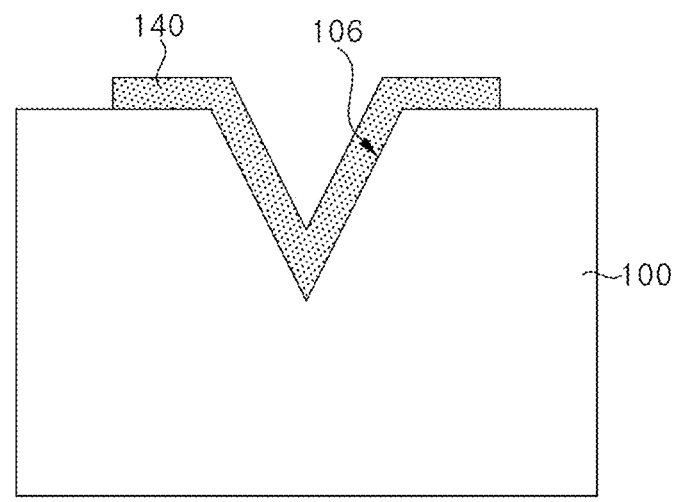
Figure 2C:
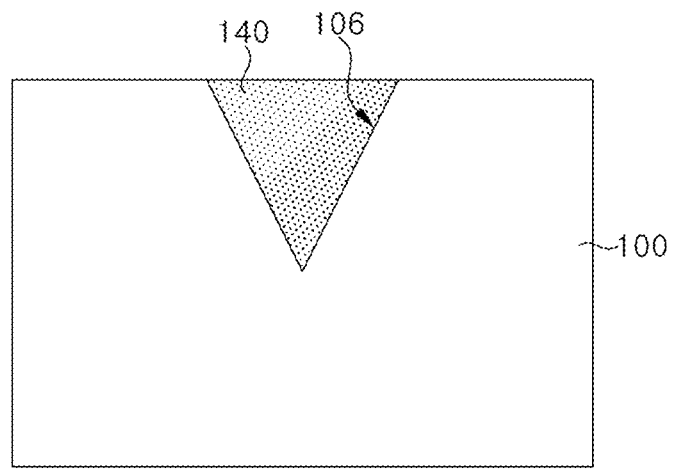
Figure 2D:
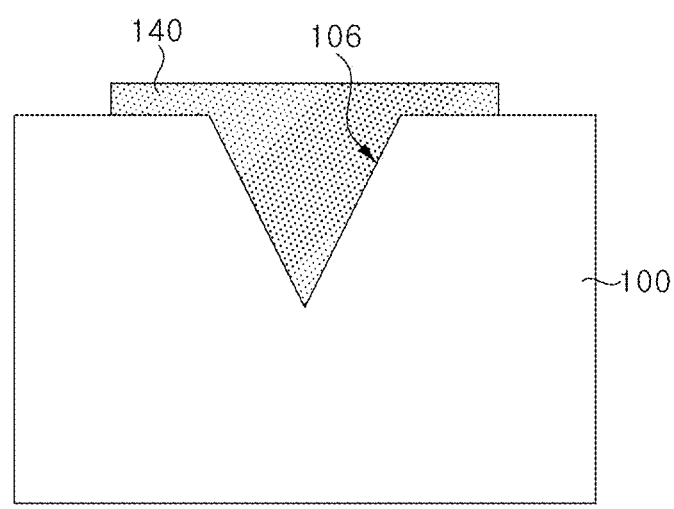

Referring to FIG. 2A, the light shielding layer 140 according to an exemplary embodiment may not completely fill the concave part 106, and may be conformally formed continuously along the inner sidewall of the concave part 106. Referring to FIG. 2B, the light shielding layer 140 according to another exemplary embodiment may not completely fill the concave part 106, may be conformally formed on the inner sidewall of the concave part 106, and may extend onto the first surface 102 of the substrate 100 to cover at least a portion of the first surface 102 of the substrate 100. Referring to FIG. 2C, the light shielding layer 140 according to another exemplary embodiment may completely fill the concave part 106, and may have a top surface coplanar with the first surface 102 of the substrate 100. Referring to FIG. 2D, the light shielding layer 140 according to another exemplary embodiment may completely fill the concave part 106, and may extend onto the first surface 102 of the substrate 100 to cover at least a portion of the first surface 102 of the substrate 100.

While the structure of the light shielding layer 140 has been described with reference to the structure of the concave part 106 illustrated in FIG. 1C, in some exemplary embodiments, the light shielding layer 140 according to exemplary embodiments may be applied to one of the structures of the concave part 106 illustrated in FIGS. 1D to 1F, and thus, repeated descriptions thereof will be omitted to avoid redundancy.

Referring back to FIGS. 1A and 1B, the light emitting cells LEC_1 and LEC_2 may be disposed on the substrate 100 and be separated from each other by a predetermined distance. The separation distance of the light emitting cells LEC_1 and LEC_2 may be changed depending on an apparatus to which the light emitting device is to be mounted.

According to an exemplary embodiment, each of the light emitting cells LEC_1 and LEC_2 may have a beam angle α of about 105 to about 150 degrees. As described above, the separation distance between the light emitting cells LEC_1 and LEC_2 may be changed depending on an apparatus, to which the light emitting cells LEC_1 and LEC_2 are to be mounted. As such, the concave part 106, which is formed with the light shielding layer 140, may be disposed in the substrate 100 between the first light emitting cell LEC_1 and the second light emitting cell LEC_2, each of which has the beam angle α of about 105 to about 150 degrees. The concave part 106 may be disposed at a position where light generated in the first light emitting cell LEC_1 (or the second light emitting cell LEC_2) is to be reflected, shielded, or absorbed by the light shielding layer 140 not to exert an influence on the second light emitting cell LEC_2 (or the first light emitting cell LEC_1).

The plurality of light emitting cells LEC_1 and LEC_2 disposed on the substrate 100 may be a unit, which is to be mounted to a target apparatus at one time. For example, when the light emitting device is formed with four light emitting cells LEC_1 and LEC_2 on the substrate 100, the four light emitting cells LEC_1 and LEC_2 may be mounted to a target apparatus through one process. While four light emitting cells LEC_1 and LEC_2 have been exemplarily described, it is to be noted that the inventive concepts are not limited to one particular number of the light emitting cells LEC_1 and LEC_2 in a light emitting device.

Each of the light emitting cells LEC_1 and LEC_2 may include a first conductivity-type semiconductor layer 110, an active layer 112, a second conductivity-type semiconductor layer 114, and an ohmic layer 116. The first conductivity-type semiconductor layer 110 may be an n-type semiconductor layer, which includes a Si-doped gallium nitride-based semiconductor layer. The second conductivity-type semiconductor layer 114 may be a p-type semiconductor layer, which includes a Mg-doped gallium nitride-based semiconductor layer. Alternatively, the first conductivity-type semiconductor layer 110 may be a p-type semiconductor layer, and the second conductivity-type semiconductor layer 114 may be an n-type semiconductor layer. The active layer 112 may include a multi-quantum well (MQW), and the composition ratio thereof may be determined to emit light of a desired peak wavelength. As the ohmic layer 116, a transparent conductive oxide (TCO), such as zinc oxide (ZnO), indium tin oxide (ITO), zinc-doped indium tin oxide (ZITO), zinc indium oxide (ZIO), gallium indium oxide (GIO), zinc tin oxide (ZTO), fluorine-doped tin oxide (FTO), gallium-doped zinc oxide (GZO), aluminum-doped zinc oxide (AZO), or others may be used.

Each of the light emitting cells LEC_1 and LEC_2 may further include a first pad 120, which is electrically coupled with the first conductivity-type semiconductor layer 110, and a second pad 130, which is electrically coupled with the ohmic layer 116. Each of the first pad 120 and the second pad 130 may include at least one of Au, Ti, Ni, Cr, and Al.

Figure 3A:
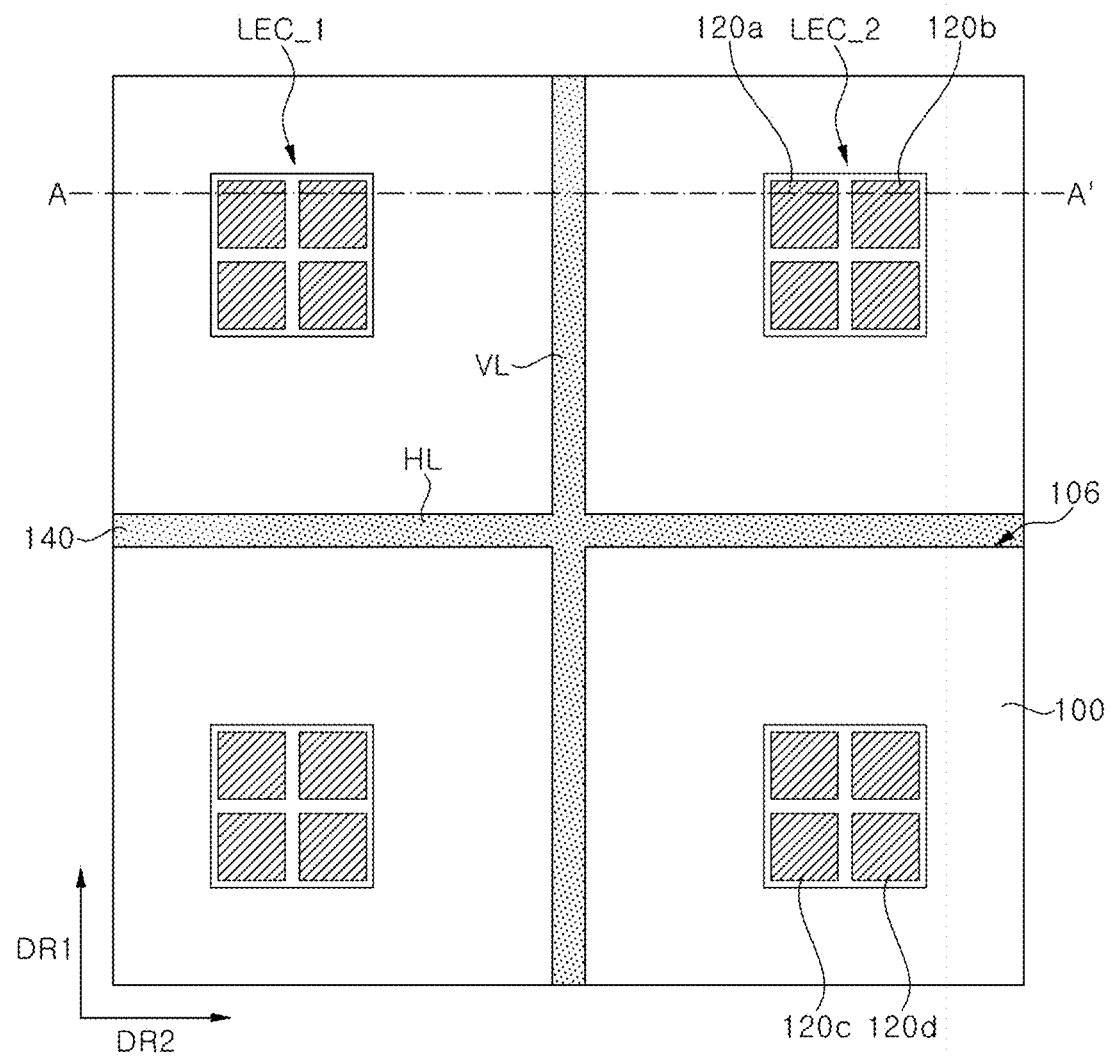
FIG. 3A is a schematic top view of a light emitting device according to another exemplary embodiment.
Figure 3B:
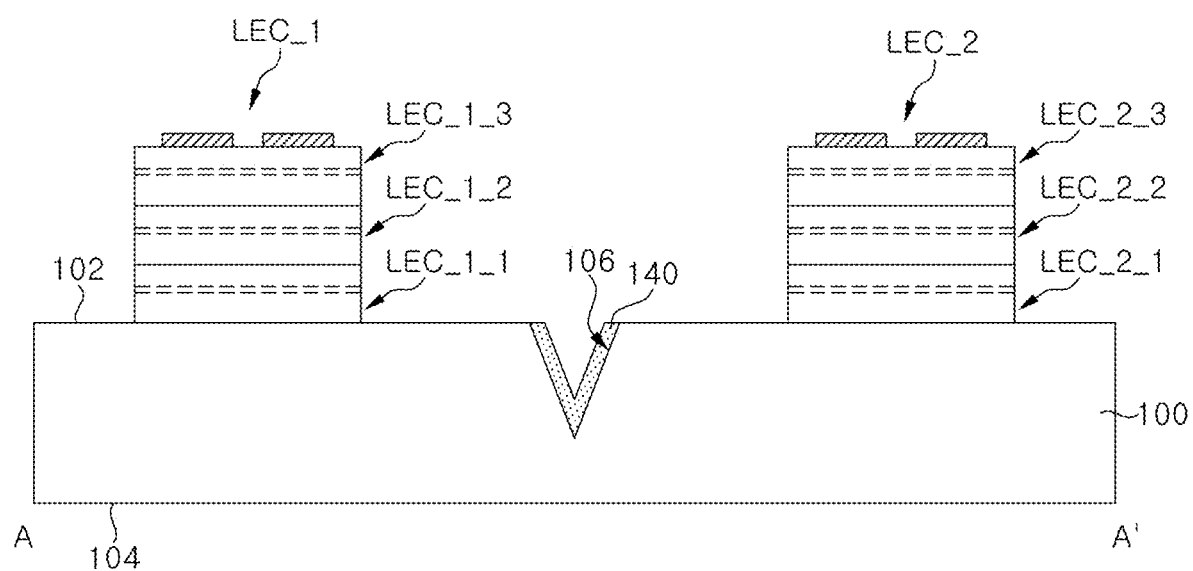
FIG. 3B is a cross-sectional view taken along line A-A' of FIG. 3A.

FIG. 3A is a schematic top view of a light emitting device according to another exemplary embodiment, and FIG. 3B is a cross-sectional view taken along line A-A' of FIG. 3A.

Referring to FIGS. 3A and 3B, the light emitting device according to the illustrated exemplary embodiment is similar to the light emitting device illustrated with reference to FIGS. 1A and 1B, however, each of the light emitting cells LEC_1 and LEC_2 according to the illustrated exemplary embodiment includes a first light emitting part LEC_1_1 or LEC_2_1, a second light emitting part LEC_1_2 or LEC_2_2, and a third light emitting part LEC_1_3 or LEC_2_3, which are vertically stacked. As such, the differences of the light emitting device will be mainly described hereinafter in order to avoid redundancy.

When the second surface 104 of the substrate 100 is a light emitting surface, the first light emitting parts LEC_1_1 and LEC_2_1 may generate light having the shortest wavelength, the second light emitting parts LEC_1_2 and LEC_2_2 may generate light having a wavelength longer than the wavelength of light generated in the first light emitting parts LEC_1_1 and LEC_2_1 and shorter than the wavelength of light generated in the third light emitting parts LEC_1_3 and LEC_2_3, and the third light emitting parts LEC_1_3 and LEC_2_3 may generate light having the longest wavelength. For example, the first light emitting parts LEC_1_1 and LEC_2_1 may generate blue light, the second light emitting parts LEC_1_2 and LEC_2_2 may generate green light, and the third light emitting parts LEC_1_3 and LEC_2_3 may emit red light. However, the inventive concepts are not limited thereto. For example, in some exemplary embodiments, the second light emitting parts LEC_1_2 and LEC_2_2 may emit light having a wavelength shorter than the wavelength of light emitted from the first light emitting parts LEC_1_1 and LEC_2_1. The first light emitting parts LEC_1_1 and LEC_2_1 may include a first n-type semiconductor layer, a first active layer, a first p-type semiconductor layer, and a first ohmic layer. The second light emitting parts LEC_1_2 and LEC_2_2 may include a second n-type semiconductor layer, a second active layer, a second p-type semiconductor layer, and a second ohmic layer. The third light emitting parts LEC_1_3 and LEC_2_3 may include a third n-type semiconductor layer, a third active layer, a third p-type semiconductor layer, and a third ohmic layer. Each of the first n-type semiconductor layer, the second n-type semiconductor layer, and the third n-type semiconductor layer may be a Si-doped gallium nitride-based semiconductor layer. Each of the first p-type semiconductor layer, the second p-type semiconductor layer and the third p-type semiconductor layer may be a Mg-doped gallium nitride-based semiconductor layer. Each of the first active layer, the second active layer, and the third active layer may include a multi-quantum well (MQW), and the composition ratio thereof may be determined to emit light of a desired peak wavelength. Each of the first ohmic layer, the second ohmic layer, and the third ohmic layer may include transparent conductive oxide, such as ZnO, ITO, ZITO, ZIO, GIO, ZTO, FTO, GZO, AZO, or others.

Each of the light emitting cells LEC_1 and LEC_2 may further include a common pad 120a, which electrically couples the first ohmic layer, the second ohmic layer and the third ohmic layer in common, a first pad 120b that is electrically coupled with the first n-type semiconductor layer, a second pad 120c that is electrically coupled with the second n-type semiconductor layer, and a third pad 120d that is electrically coupled with the third n-type semiconductor layer. Alternatively, each of the light emitting cells LEC_1 and LEC_2 may further include a common pad 120a, which electrically couples the first n-type semiconductor layer, the second n-type semiconductor layer, and the third n-type semiconductor layer in common, a first pad 120b that is electrically coupled with the first ohmic layer, a second pad 120c that is electrically coupled with the second ohmic layer, and a third pad 120d that is electrically coupled with the third ohmic layer.

For example, when each of the light emitting cells LEC_1 and LEC_2 includes the first light emitting part LEC_1_1 or LEC_2_1, the second light emitting part LEC_1_2 or LEC_2_2, and the third light emitting part LEC_1_3 or LEC_2_3 which are vertically stacked, the third light emitting part LEC_1_3 or LEC_2_3 may expose at least a portion of the second light emitting part LEC_1_2 or LEC_2_2, and the second light emitting part LEC_1_2 or LEC_2_2 may expose at least a portion of the first light emitting part LEC_1_1 or LEC_2_1, such that the common pad 120a, the first pad 120b, the second pad 120c and the third pad 120d are electrically coupled with the first light emitting part LEC_1_1 or LEC_2_1, the second light emitting part LEC_1_2 or LEC_2_2, and the third light emitting part LEC_1_3 or LEC_2_3. In this case, the third light emitting part LEC_1_3 or LEC_2_3 may be smaller than the second light emitting part LEC_1_2 or LEC_2_2, and the second light emitting part LEC_1_2 or LEC_2_2 may be smaller than the first light emitting part LEC_1_1 or LEC_2_1.

As another example, the first light emitting part LEC_1_1 or LEC_2_1, the second light emitting part LEC_1_2 or LEC_2_2, and the third light emitting part LEC_1_3 or LEC_2_3 may have substantially the same size, and each of the light emitting cells LEC_1 and LEC_2 may further include a plurality of via structures, which electrically couple the common pad 120a, the first pad 120b, the second pad 120c, and the third pad 120d with the first light emitting part LEC_1_1 or LEC_2_1, the second light emitting part LEC_1_2 or LEC_2_2, and the third light emitting part LEC_1_3 or LEC_2_3.

As yet another example, the first light emitting part LEC_1_1 or LEC_2_1 and the second light emitting part LEC_1_2 or LEC_2_2 may have substantially the same size, and the third light emitting part LEC_1_3 or LEC_2_3 may expose at least a portion of the second light emitting part LEC_1_2 or LEC_2_2, such that the common pad 120a, the first pad 120b, the second pad 120c, and the third pad 120d are electrically coupled with the first light emitting part LEC_1_1 or LEC_2_1, the second light emitting part LEC_1_2 or LEC_2_2, and the third light emitting part LEC_1_3 or LEC_2_3. In this case, the first light emitting part LEC_1_1 or LEC_2_1 and the second light emitting part LEC_1_2 or LEC_2_2 may be electrically coupled with the common pad 120a, the first pad 120b, and the second pad 120c by a plurality of via structures.

In the illustrated exemplary embodiment, the concave part 106 and the light shielding layer 140 described reference with FIGS. 1A through 1F, as well as FIGS. 2A through 2D, may be similarly employed.

The light emitting device according to the illustrated exemplary embodiment is described as including three vertically stacked light emitting parts, however, the inventive concepts are not limited thereto. In some exemplary embodiments, a light emitting device may include two light emitting parts or more than four light emitting parts, which may be vertically stacked.

Further, each light emitting cell may have light emitting parts that are vertically stacked, but the inventive concepts are not limited thereto, and in some exemplary embodiments, at least one light emitting cell may have a single light emitting part.

The vertically stacked light emitting parts according to the illustrated exemplary embodiment may be applied to light emitting cells of various exemplary embodiments to be described later.

Figure 4A:
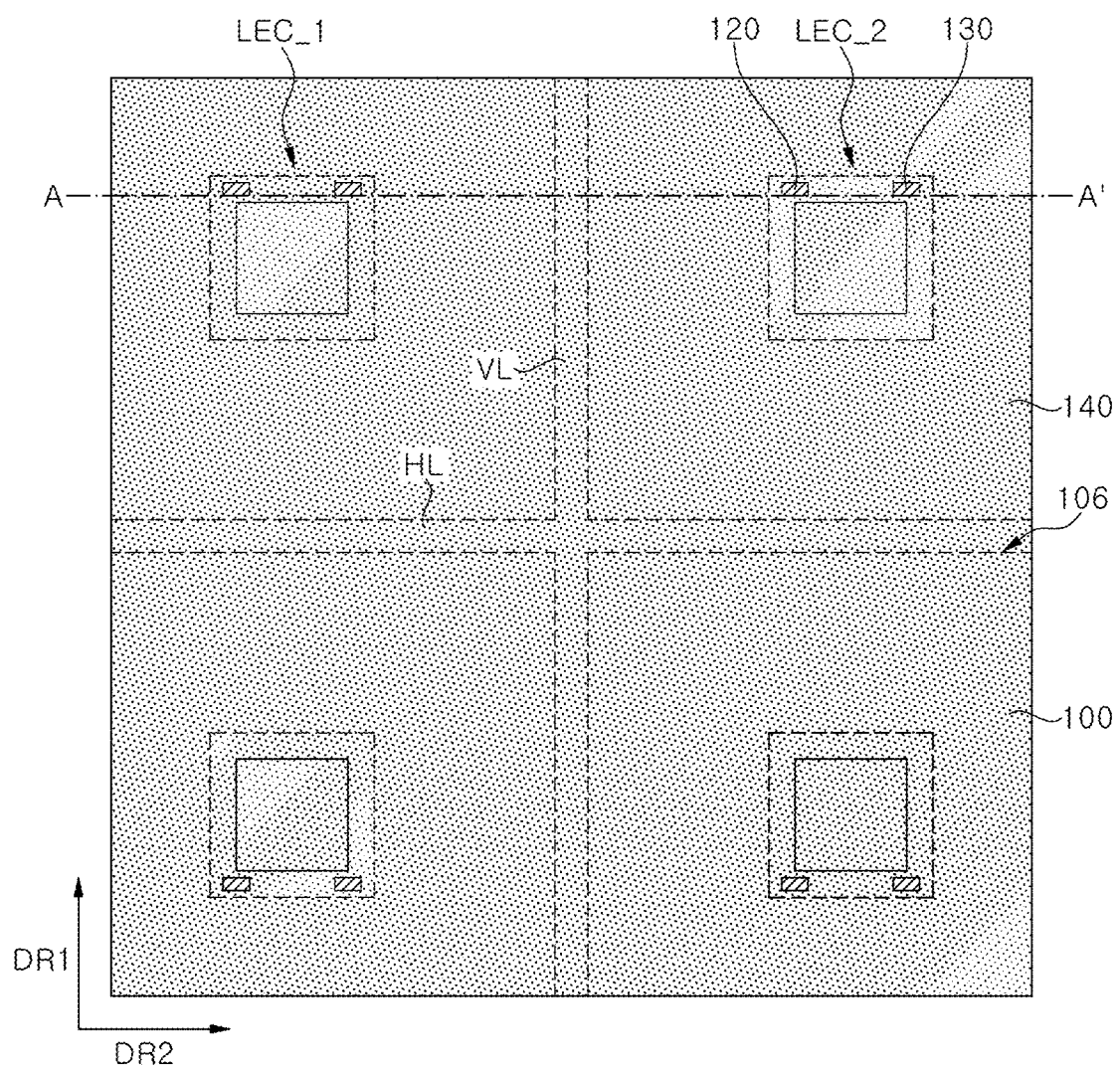
FIG. 4A is a schematic top view of a light emitting device according to another exemplary embodiment.
Figure 4B:
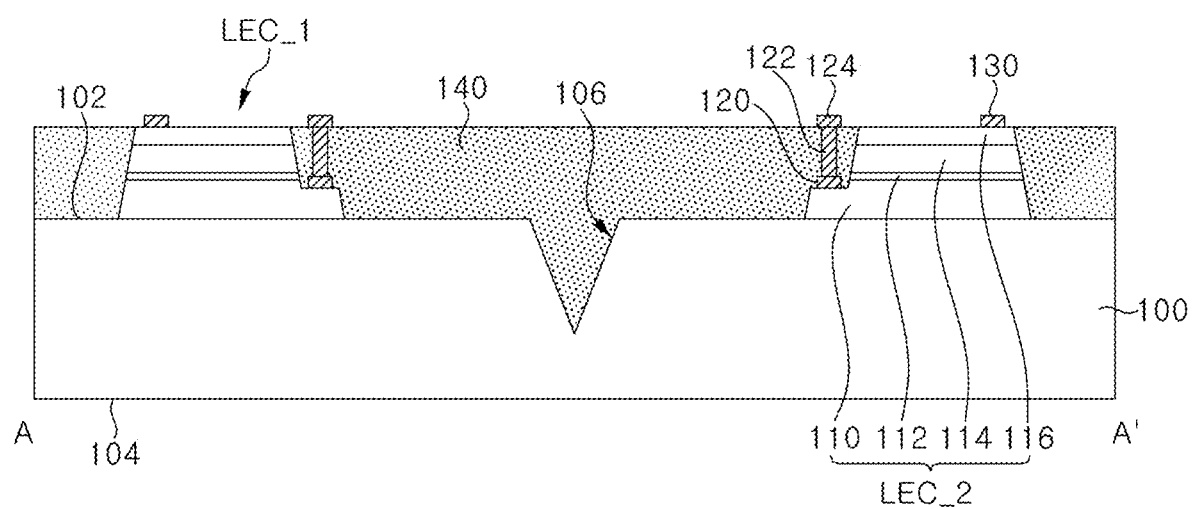
FIG. 4B is a cross-sectional view taken along line A-A' of FIG. 4A.
Figure 5A:
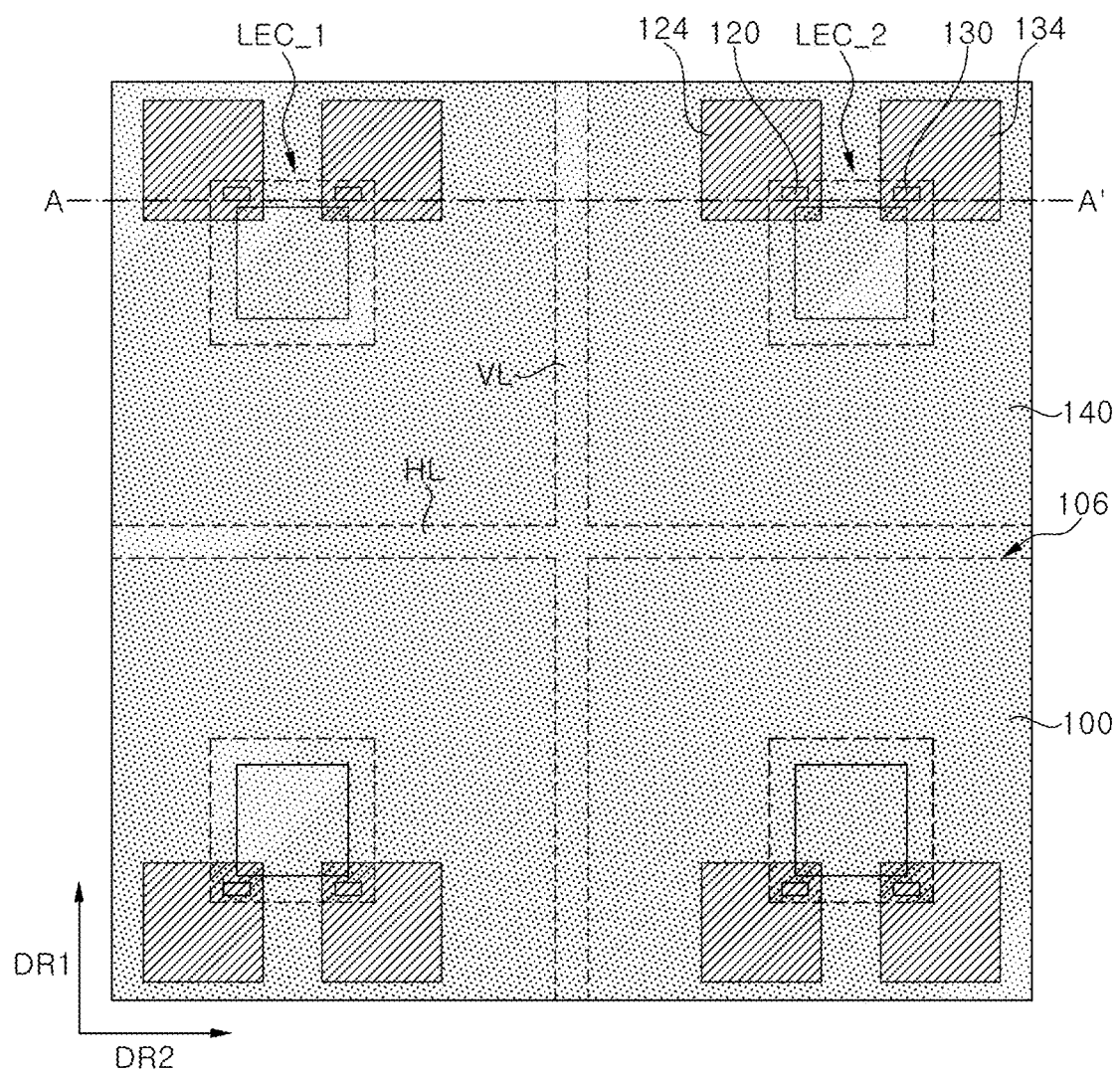
FIG. 5A is a schematic top view of a light emitting device according to another exemplary embodiment.
Figure 5B:
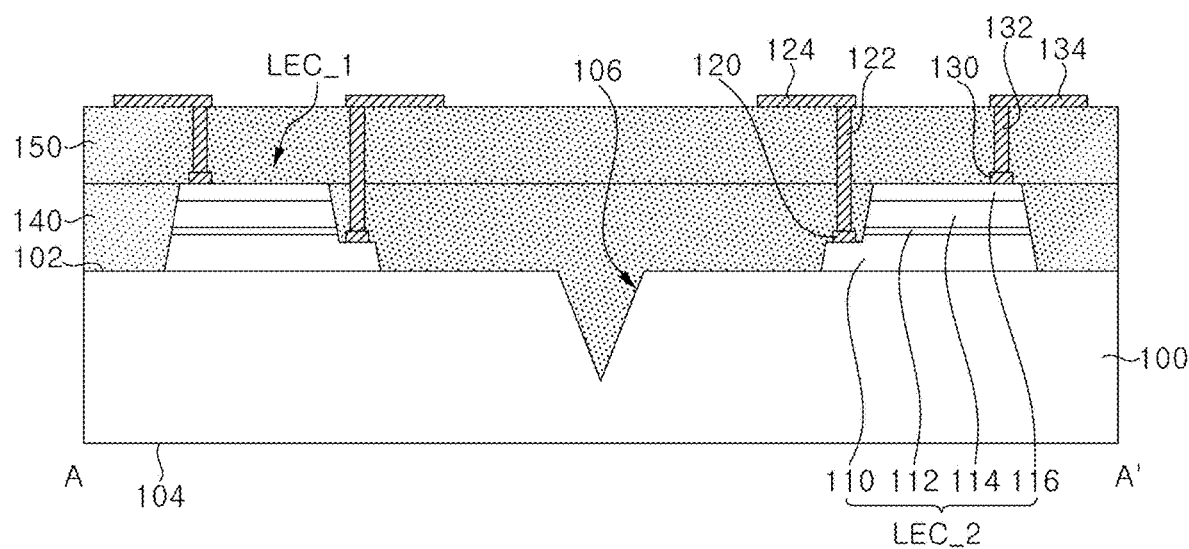
FIG. 5B is a cross-sectional view taken along line A-A' of FIG. 5A.

FIG. 4A is a schematic top view of a light emitting device according to another exemplary embodiment, and FIG. 4B is a cross-sectional view taken along line A-A' of FIG. 4A. FIG. 5A is a schematic top view of a light emitting device according to still another exemplary embodiment, and FIG. 5B is a cross-sectional view taken along line A-A' of FIG. 5A.

Referring to FIGS. 4A, 4B, 5A and 5B, a light emitting device may include a substrate 100 and a plurality of light emitting cells LEC_1 and LEC_2 disposed on the substrate 100.

The substrate 100 may have a first surface 102, on which the light emitting cells LEC_1 and LEC_2 are disposed, and a second surface 104 opposing the first surface 102. The first surface 102 of the substrate 100 may be formed with a concave part 106, which extends from the first surface 102 to the inside of the substrate 100. Since the substrate 100 and the concave part 106 are substantially the same as those described above with reference to FIGS. 1A and 1B, repeated descriptions thereof will be omitted.

The first concave part 106 according to the illustrated exemplary embodiment may have the structure of the concave part 106 described above with reference to FIGS. 1C to 1F, without being limited thereto.

The light emitting cells LEC_1 and LEC_2 may be disposed on the first surface 102 of the substrate 100 and be separated by a predetermined distance. Each of the light emitting cells LEC_1 and LEC_2 may include a first conductivity-type semiconductor layer 110, an active layer 112, a second conductivity-type semiconductor layer 114, and an ohmic layer 116, which are vertically stacked, a first pad 120 electrically coupled with the first conductivity-type semiconductor layer 110, and a second pad 130 electrically coupled with the ohmic layer 116.

A light shielding layer 140 may be disposed to fill the concave part 106 and cover the light emitting cells LEC_1 and LEC_2 on the first surface 102. The light shielding layer 140 may include an insulating material, such as a photoresist, epoxy, PDMS, and a black matrix.

When light generated in respective active layers 112 of the light emitting cells LEC_1 and LEC_2 are emitted in all directions, the light shielding layer 140 may be disposed between the light emitting cells LEC_1 and LEC_2 and prevent the lights from being mixed. In particular, since the light shielding layer 140 is disposed between the neighboring light emitting cells LEC_1 and LEC_2, for example, a first light emitting cell LEC_1 and a second light emitting cell LEC_2, on the first surface 102 of the substrate 100, light generated in the active layer 112 of the first light emitting cell LEC_1 may be radiated toward the first surface 102 of the substrate 100 while not exerting an influence on the second light emitting cell LEC_2, and light generated in the active layer 112 of the second light emitting cell LEC_2 may be radiated toward the first surface 102 of the substrate 100 while not exerting an influence on the first light emitting cell LEC_1. Although light of the first light emitting cell LEC_1 and light of the second light emitting cell LEC_2, which are emitted toward the substrate 100, may be radiated in all directions in the substrate 100, light of the first light emitting cell LEC_1 and light of the second light emitting cell LEC_2 may be reflected, shielded, or absorbed by the light shielding layer 140 filling the concave part 106, thereby not exerting an influence on each other.

Further, as the light shielding layer 140 fills the concave part 106 and cover the light emitting cells LEC_1 and LEC_2, the substrate 100 having a thin thickness may be prevented from being broken or damaged by an external shock.

Referring to FIGS. 4A and 4B, the top surface of the light shielding layer 140 may be substantially coplanar with the top surfaces of the ohmic layers 116. The light shielding layer 140 may expose the ohmic layers 116. For example, each first pad 120 may be buried by the light shielding layer 140, and may be electrically coupled with a third pad 124 disposed on the light shielding layer 140 through a through electrode 122 passing through the light shielding layer 140. The second pad 130 may be disposed on the ohmic layer 116, which is exposed on the light shielding layer 140.

Referring to FIGS. 5A and 5B, an insulating layer 150 may be additionally disposed on the light shielding layer 140. The insulating layer 150 may include substantially the same material as the light shielding layer 140. Alternatively, the insulating layer 150 may include a silicon oxide or a silicon nitride. The light emitting device according to the illustrated exemplary embodiment may further include a first through electrode 122, which passes through the insulating layer 150 and the light shielding layer 140 and is electrically coupled with the first pad 120, a second through electrode 132, which passes through the insulating layer 150 and is electrically coupled with the second pad 130, a third pad 124, which is disposed on the insulating layer 150 and is brought into electrical contact with the first through electrode 122, and a fourth pad 134, which is disposed on the insulating layer 150 and is brought into electrical contact with the second through electrode 132. In this case, when the separation distance between the first pad 120 and the second pad 130 is different from a separation distance required for an apparatus to which the light emitting device is to be mounted, the separation distance between the first pad 120 and the second pad 130 may be adjusted by changing the positions of the third pad 124, which is electrically coupled with the first pad 120, and the fourth pad 134, which is electrically coupled with the second pad 130.

Since the substrate 100, the concave part 106, the light shielding layer 140, and the plurality of light emitting cells LEC_1 and LEC_2 illustrated in FIGS. 4A, 4B, 5A and 5B are substantially the same as those of the substrate 100, the concave part 106, the light shielding layer 140, and the plurality of light emitting cells LEC_1 and LEC_2 described above with reference to FIGS. 1A to 1F and 2A to 2D, repeated descriptions thereof will be omitted.

Figure 6A:
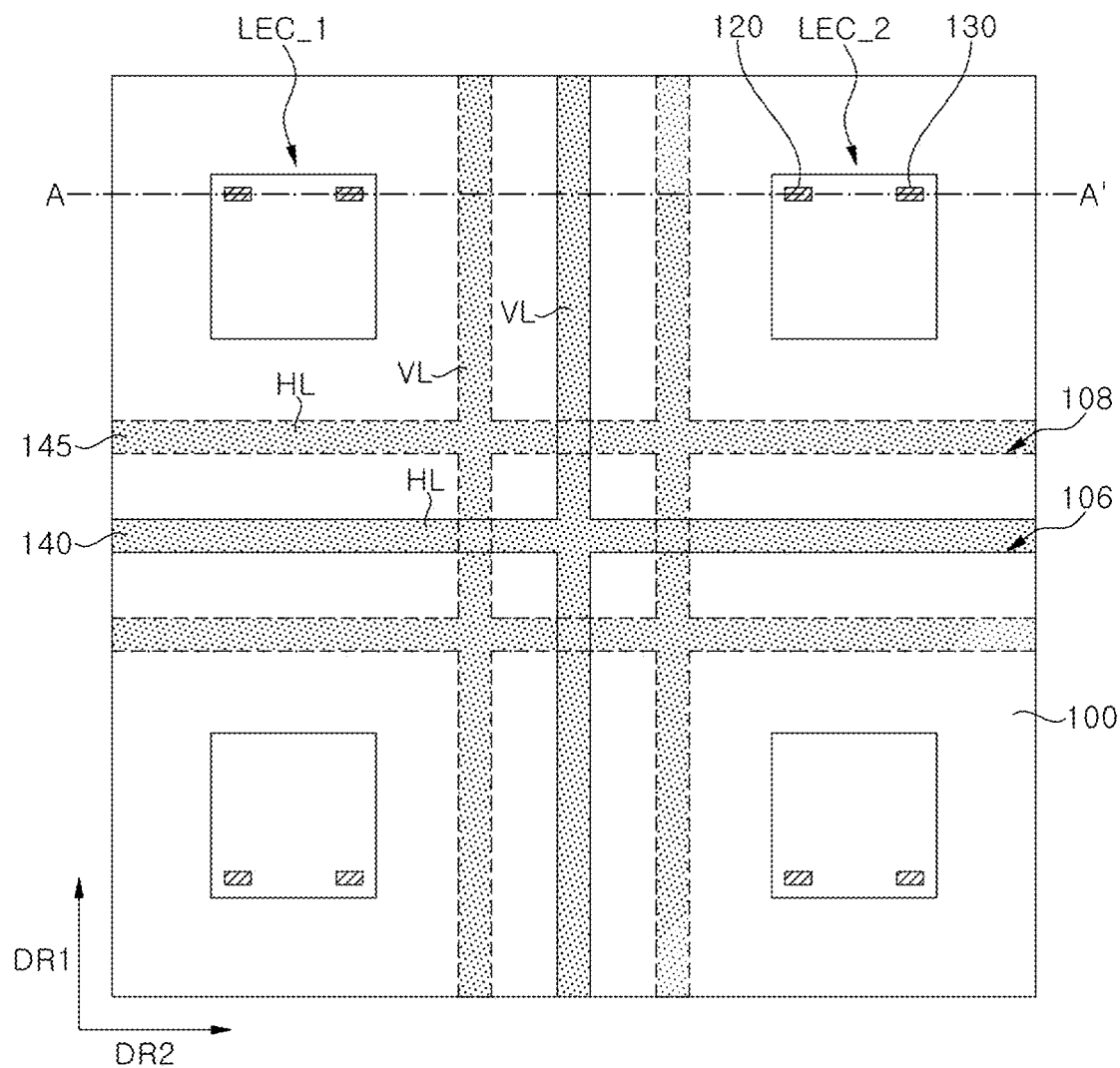
FIG. 6A is a schematic top view of a light emitting device according to another exemplary embodiment.
Figure 6B:
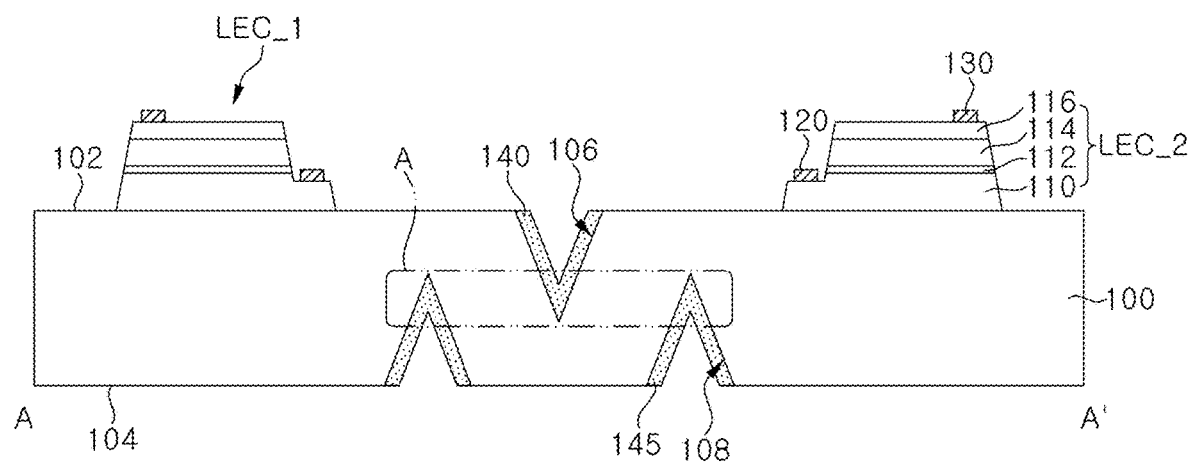
FIG. 6B is a cross-sectional view taken along line A-A' of FIG. 6A.

FIG. 6A is a schematic top view of a light emitting device according to another exemplary embodiment, and FIG. 6B is a cross-sectional view taken along line A-A' of FIG. 6A.

Referring to FIGS. 6A and 6B, a light emitting device may include a substrate 100 and a plurality of light emitting cells LEC_1 and LEC_2 disposed on the substrate 100.

The substrate 100 may have a first surface 102, on which the light emitting cells LEC_1 and LEC_2 are disposed, and a second surface 104 opposing the first surface 102. The first surface 102 of the substrate 100 may be formed with a first concave part 106, which extends from the first surface 102 to the inside of the substrate 100. The first concave part 106 may include a vertical part VL extending in a first direction DR1, and a horizontal part HL extending in a second direction DR2 substantially perpendicular to the first direction DR1. In some exemplary embodiments, the vertical part VL and the horizontal part HL of the first concave part 106 may cross with each other. The second surface 104 of the substrate 100 may be formed with a second concave part 108, which extends from the second surface 104 to the inside of the substrate 100. The second concave part 108 may include vertical parts VL extending in the first direction DR1 and are parallel to each other, and horizontal parts HL extending in the second direction DR2 and are parallel to each other. In some exemplary embodiments, the vertical parts VL and the horizontal parts HL of the second concave part 108 may cross with each other.

When viewed from the top, the vertical part VL of the first concave part 106 may not overlap with the vertical parts VL of the second concave part 108, and the horizontal part HL of the first concave part 106 may not overlap with the horizontal parts HL of the second concave part 108. For example, the vertical part VL of the first concave part 106 may be disposed between the two neighboring vertical parts VL of the second concave part 108. The horizontal part HL of the first concave part 106 may be disposed between the two neighboring horizontal parts HL of the second concave part 108. The second concave part 108 may be disposed more adjacent to the light emitting cells LEC_1 and LEC_2 than the first concave part 106.

In a cross-sectional view, the vertical part VL of the first concave part 106 may be disposed between the two neighboring vertical parts VL of the second concave part 108. Referring to the part A of FIG. 6B, the end of the vertical part VL of the first concave part 106 and the ends of the vertical parts VL of the second concave part 108 may overlap with each other.

While each of the first concave part 106 and the second concave part 108 is illustrated as having the structure described above with reference to FIG. 1C, however, the inventive concepts are not limited thereto. For example, in some exemplary embodiments, each of the first concave part 106 and the second concave part 108 may have the structures of the concave part 106 described above with reference to FIGS. 1D to 1F, without being limited thereto.

A first light shielding layer 140 may fill at least a portion of the first concave part 106. A second light shielding layer 145 may fill at least a portion of the second concave part 108. Each of the first light shielding layer 140 and the second light shielding layer 145 may include metal, such as Ti, Ni, Al, Ag, and Cr, or may include a material, such as a photoresist, epoxy, PDMS, and a black matrix. While each of the first light shielding layer 140 and the second light shielding layer 145 is illustrated as having the structure of FIG. 2A, however, the inventive concepts are not limited thereto. For example, in some exemplary embodiments, each of the first light shielding layer 140 and the second light shielding layer 145 may have the structures of the light shielding layer 140 described above with reference to FIGS. 2B to 2D, without being limited thereto.

Light generated from the plurality of light emitting cells LEC_1 and LEC_2, for example, a first light emitting cell LEC_1 and a second light emitting cell LEC_2, may be reflected, shielded, or absorbed by the second light shielding layer 145, which is disposed adjacent to the light emitting cells LEC_1 and LEC_2, and light passed through the space excluding the second light shielding layer 145 may be reflected, shielded, or absorbed by the first light shielding layer 140. As the second light shielding layer 145 and the first light shielding layer 140 are disposed between the first light emitting cell LEC_1 and the second light emitting cell LEC_2, light generated in the first light emitting cell LEC_1 may not exert an influence on the second light emitting cell LEC_2, and light generated in the second light emitting cell LEC_2 may not exert an influence on the first light emitting cell LEC_1. In this manner, it is possible to prevent mixture of light generated from a plurality of light emitting cells.

Since the substrate 100, the first concave part 106, the second concave part 108, the first light shielding layer 140, the second light shielding layer 145 and the plurality of light emitting cells LEC_1 and LEC_2 illustrated in FIGS. 6A and 6B are substantially the same as those of the substrate 100, the concave part 106, the light shielding layer 140 and the plurality of light emitting cells LEC_1 and LEC_2 described above with reference to FIGS. 1A to 1F and 2A to 2D, repeated descriptions thereof will be omitted.

Figure 7A:
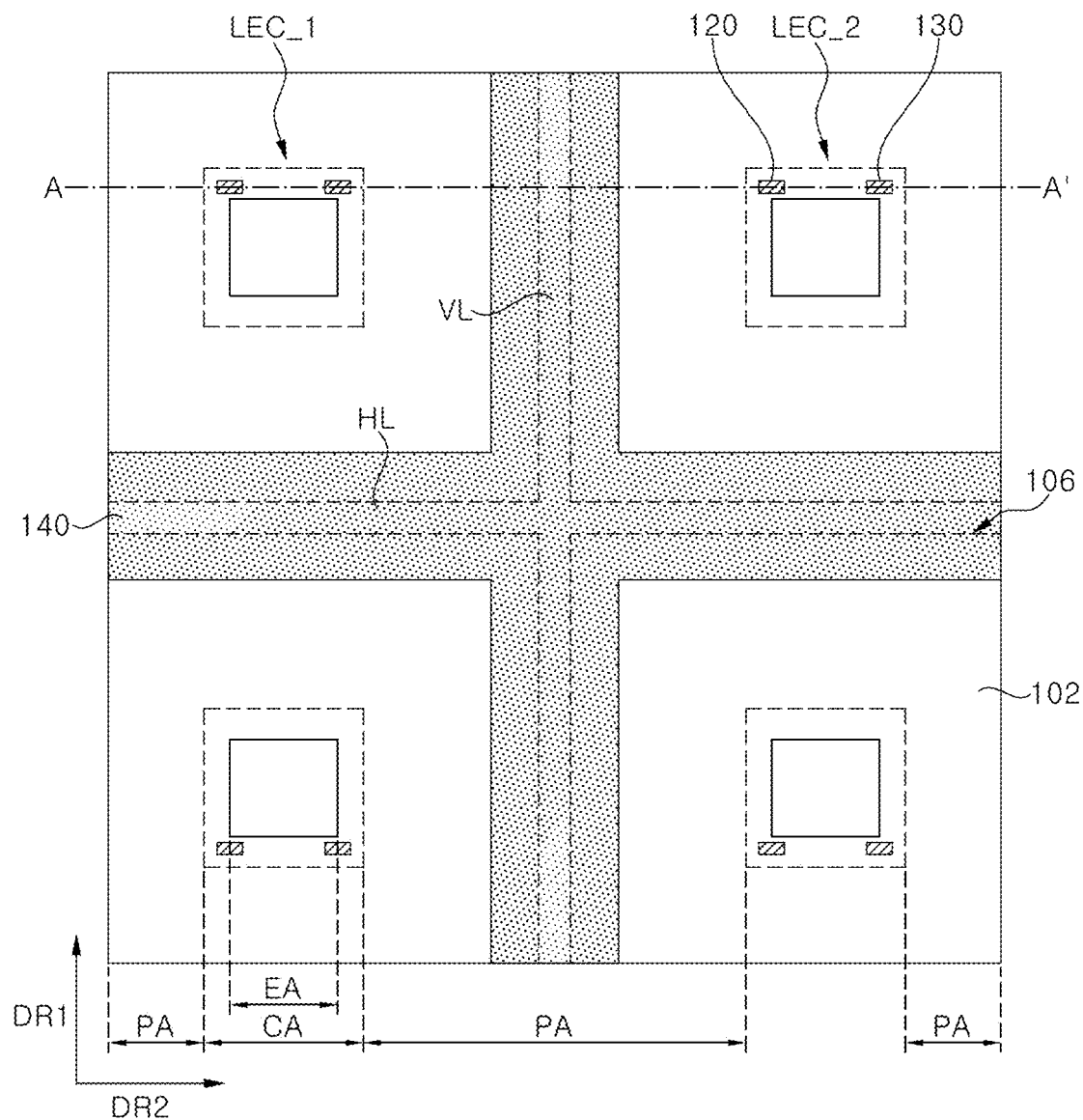
FIGS. 7A and 7B are schematic top views of a light emitting device according to another exemplary embodiment.
Figure 7B:
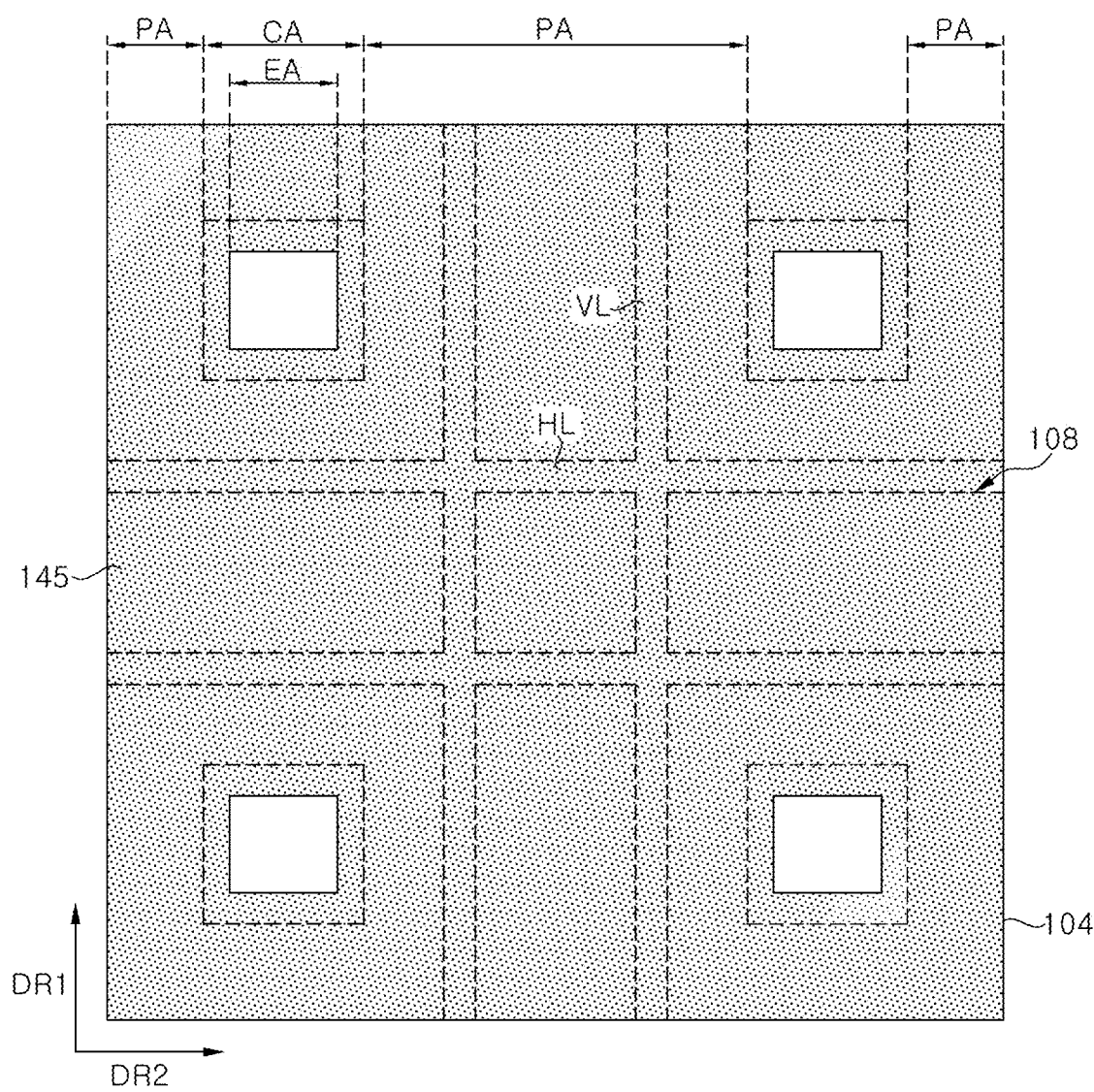
Figure 7C:
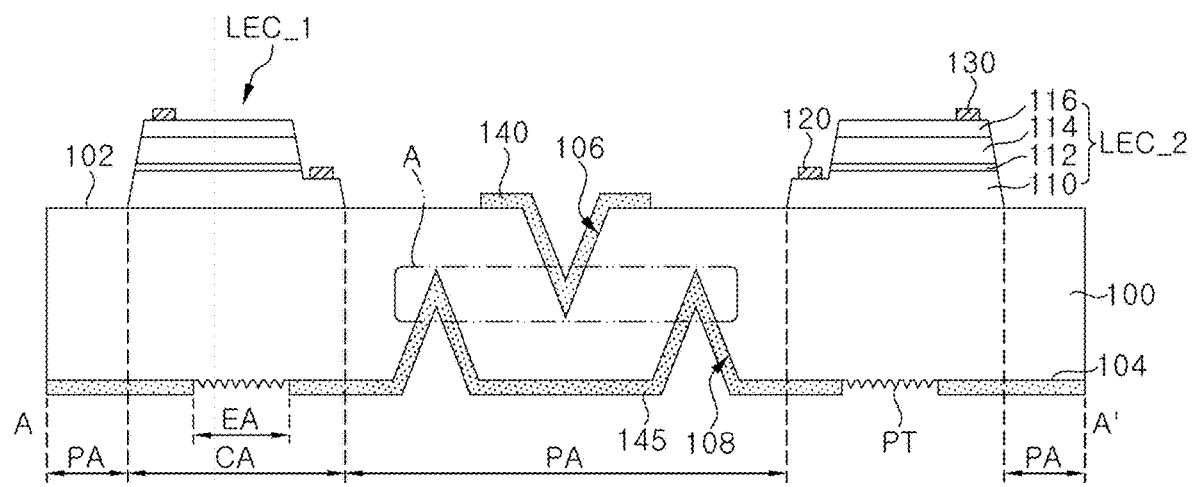
FIG. 7C is a cross-sectional view taken along line A-A' of FIG. 7A.

FIGS. 7A and 7B are schematic top views of a light emitting device according to another exemplary embodiment, and FIG. 7C is a cross-sectional view taken along the A-A' of FIG. 7A. FIG. 7A is a top view obtained when viewing the light emitting device from one side, for example, a position where pads are disposed, and FIG. 7B is a top view obtained when viewing the light emitting device from the opposing side, for example, a light emitting surface.

Referring to FIGS. 7A to 7C, a light emitting device may include a substrate 100 and a plurality of light emitting cells LEC_1 and LEC_2 disposed on the substrate 100.

The substrate 100 may have a first surface 102, on which the light emitting cells LEC_1 and LEC_2 are disposed, and a second surface 104 opposing the first surface 102. A first concave part 106 may be formed in the first surface 102 of the substrate 100, and a second concave part 108 may be formed in the second surface 104 of the substrate 100. The first concave part 106 may include a vertical part VL and a horizontal part HL, and the second concave part 108 may include vertical parts VL and horizontal parts HL. The light emitting cells LEC_1 and LEC_2 may be disposed on the first surface 102 of the substrate 100, and each of the light emitting cells LEC_1 and LEC_2 may include a first conductivity-type semiconductor layer 110, an active layer 112, a second conductivity-type semiconductor layer 114, and an ohmic layer 116. The light emitting device may further include first pads 120 electrically coupled with first conductivity-type semiconductor layers 110 of the light emitting cells LEC_1 and LEC_2, and second pads 130 electrically coupled with the ohmic layers 116 of the light emitting cells LEC_1 and LEC_2. Since the substrate 100, the first concave part 106, the second concave part 108, the light emitting cells LEC_1 and LEC_2, the first pads 120, and the second pads 130 are substantially the same as the substrate 100, the first concave part 106, the second concave part 108, the light emitting cells LEC_1 and LEC_2, the first pads 120, and the second pads 130 described above with reference to FIGS. 6A and 6B, repeated descriptions thereof will be omitted.

The substrate 100 may include cell areas CA, where the light emitting cells LEC_1 and LEC_2 are positioned, and a peripheral area PA excluding the cell areas CA. Each of the cell areas CA may include a light emitting area EA, through which light is emitted. The light emitting area EA may be smaller than the cell area CA.

Referring to FIGS. 7A and 7C, a first light shielding layer 140, which fills at least a portion of the first concave part 106, may be provided on the first surface 102 of the substrate 100. The first light shielding layer 140 may be disposed to cover a portion of the peripheral area PA, so as to expose the cell areas CA.

Referring to FIGS. 7B and 7C, a second light shielding layer 145, which fills at least a portion of the second concave part 108, may be provided on the second surface 104 of the substrate 100. The second light shielding layer 145 may cover the peripheral area PA and partially cover the cell areas CA, thereby exposing light emitting areas EA. For example, when each cell area CA has a quadrangular structure when viewed from the top, each light emitting area EA may have a quadrangular structure concentric with each cell area CA with a smaller size than the corresponding cell area CA.

While each of the first light shielding layer 140 and the second light shielding layer 145 is illustrated as having the structure described above with reference to FIG. 2B, however, in some exemplary embodiments, the first light shielding layer 140 may have at least one of the structures of the first light shielding layer 140 illustrated in FIGS. 2A, 2C to 2D, without being limited thereto.

In this case, light emitted from the light emitting cells LEC_1 and LEC_2 are radiated through the light emitting areas EA having a size smaller than each of the light emitting cells LEC_1 and LEC_2, and a portion of the substrate 100 excluding the light emitting areas EA is shielded by the second light shielding layer 145. As such, light emitted from the light emitting cells LEC_1 and LEC_2 may be emitted by being concentrated in the light emitting areas EA. In this manner, the light emitting device may have an excellent contrast.

In addition, although the thickness of the substrate 100 is thin, because the first light shielding layer 140 and the second light shielding layer 145 are formed on the first surface 102 and the second surface 104 of the substrate 100, respectively, it is possible to prevent the substrate 100 from being broken by an external shock and prevent the light emitting device from being damaged. Also, when the substrate 100 includes a glass material and the second surface 104 of the substrate 100 is a light extraction surface, a phenomenon that external light is reflected by the second surface 104, which function as the light extraction surface, and cause an unintended external object to be recognized may be prevented by the second light shielding layer 145 formed on the second surface 104.

According to an exemplary embodiment, rough structures PT may be formed on the second surface 104 of the substrate 100 corresponding to the light emitting areas EA, by using a roughing process. As each of the light emitting areas EA has the rough structure PT, light emitted through each light emitting area EA, which is smaller than each of the light emitting cells LEC_1 and LEC_2, may be scattered by the rough structure PT, such that the light extraction effect of the light emitting device may be improved. In some exemplary embodiments, the rough structures PT corresponding to the light emitting areas EA on the second surface 104 of the substrate 100 may be omitted.

Since the substrate 100, the first concave part 106, the second concave part 108, the first light shielding layer 140, the second light shielding layer 145, and the plurality of light emitting cells LEC_1 and LEC_2 illustrated in FIGS. 7A to 7C are substantially the same as those for the substrate 100, the concave part 106, the light shielding layer 140, and the plurality of light emitting cells LEC_1 and LEC_2 described above with reference to FIGS. 1A to 1F and 2A to 2D, repeated descriptions thereof will be omitted.

Figure 8A:
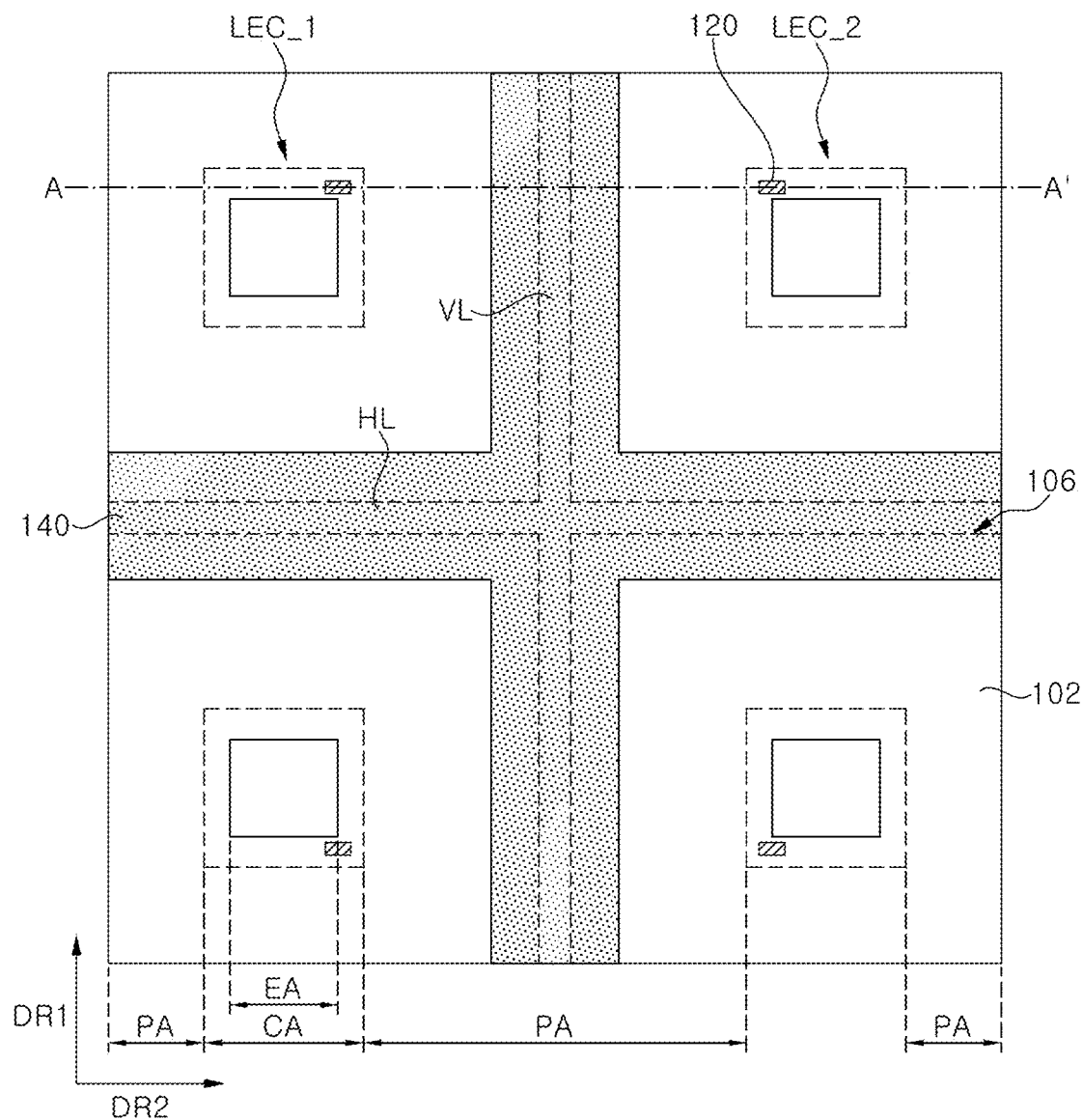
FIGS. 8A and 8B are schematic top views of a light emitting device according to another exemplary embodiment.
Figure 8B:
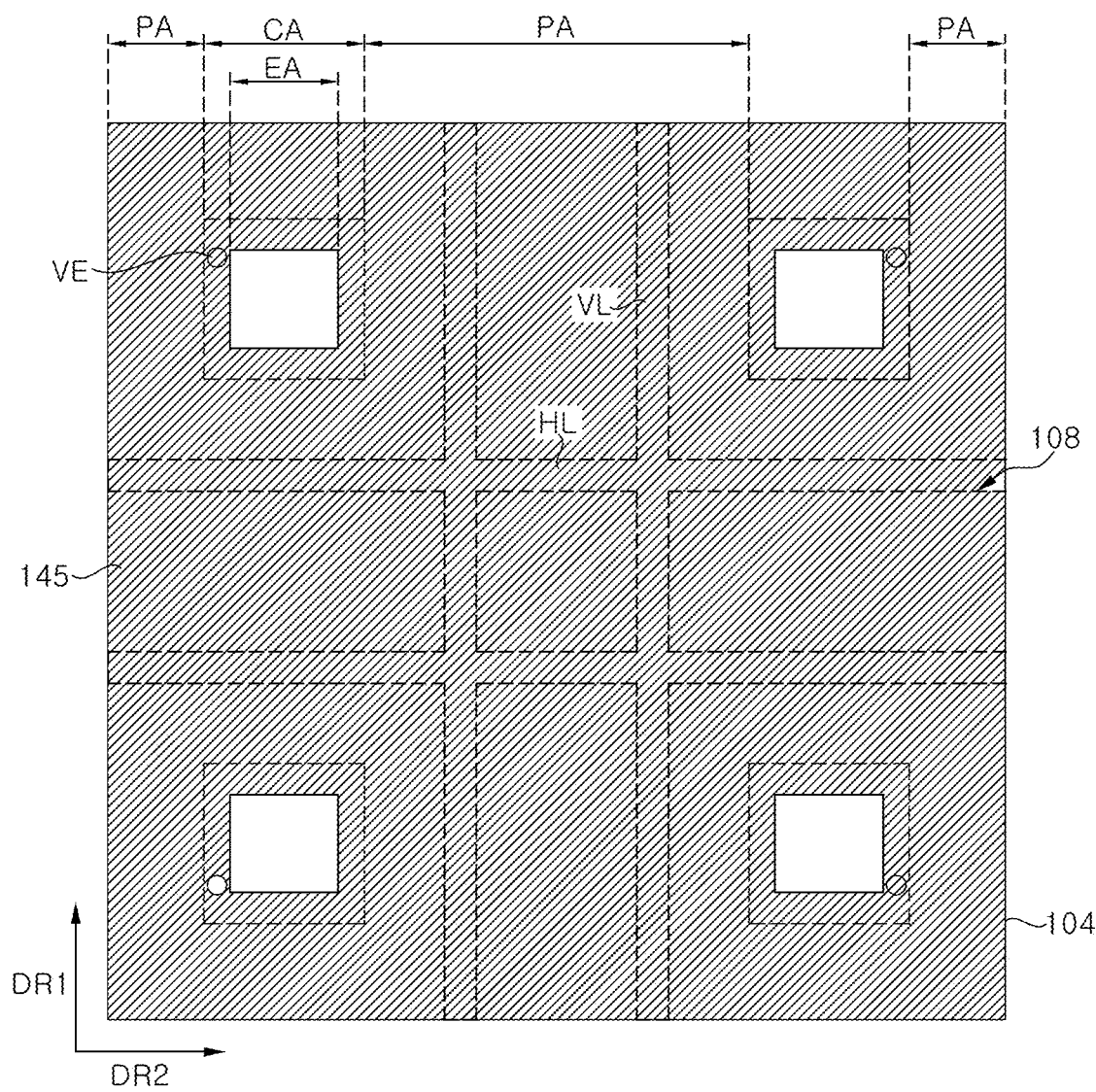
Figure 8C:
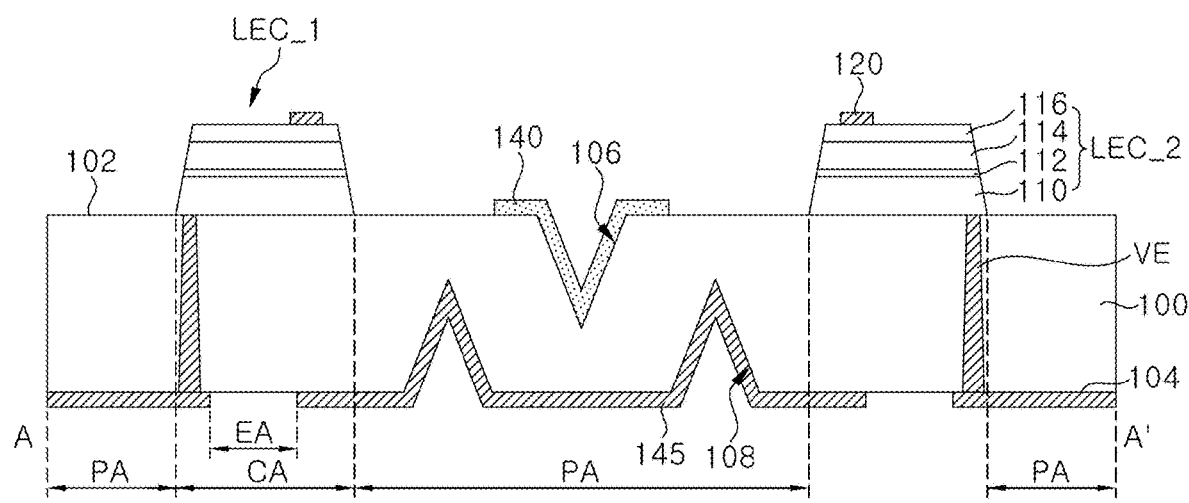
FIG. 8C is a cross-sectional view taken along line A-A' of FIG. 8A.

FIGS. 8A and 8B are schematic top views of a light emitting device according to another exemplary embodiment, and FIG. 8C is a cross-sectional view taken along line A-A' of FIG. 8A. FIG. 8A is a top view obtained when viewing the light emitting device from one side, for example, a position where pads are disposed, and FIG. 8B is a top view obtained when viewing the light emitting device from the opposing side, for example, a light emitting surface.

Referring to FIGS. 8A to 8C, a light emitting device may include a substrate 100 and a plurality of light emitting cells LEC_1 and LEC_2 disposed on the substrate 100.

The substrate 100 may have a first surface 102, on which the light emitting cells LEC_1 and LEC_2 are disposed, and a second surface 104 opposing the first surface 102. The substrate 100 may include cell areas CA, where the light emitting cells LEC_1 and LEC_2 are positioned, and a peripheral area PA excluding the cell areas CA. Each of the cell areas CA may include a light emitting area EA. The light emitting area EA may be smaller than the cell area CA. A first concave part 106 may be formed in the first surface 102 of the substrate 100, and a second concave part 108 may be formed in the second surface 104 of the substrate 100. The first concave part 106 may include a vertical part VL and a horizontal part HL, and the second concave part 108 may include vertical parts VL and horizontal parts HL.

Since the substrate 100, the first concave part 106, and the second concave part 108 are substantially the same as the substrate 100, the first concave part 106, and the second concave part 108 described above with reference to FIGS. 7A to 7C, repeated descriptions thereof will be omitted.

The light emitting device may further include a first light shielding layer 140, which is formed in the first concave part 106, and a second light shielding layer 145, which is formed in the second concave part 108. The first light shielding layer 140 may fill at least a portion of the first concave part 106, and may have the structure illustrated in FIG. 2B. The second light shielding layer 145 may fill at least a portion of the second concave part 108, and may have the structure illustrated in FIG. 2B.

While the first light shielding layer 140 and the second light shielding layer 145 are illustrated as having the structure illustrated in FIG. 2B, however, the inventive concepts are not limited thereto. For example, in some exemplary embodiments, the first light shielding layer 140 and the second light shielding layer 145 may have at least one of the structures of the first light shielding layer 140 illustrated in FIGS. 2A, 2C to 2D, without being limited thereto.

According to an exemplary embodiment, the first light shielding layer 140 may include metal, such as Ti, Ni, Al, Ag, and Cr, or may include a material, such as a photoresist, epoxy, PDMS, and a black matrix. The second light shielding layer 145 may include metal, such as Ti, Ni, Al, Ag, and Cr.

Each of the light emitting cells LEC_1 and LEC_2 may include a first conductivity-type semiconductor layer 110, an active layer 112, a second conductivity-type semiconductor layer 114, and an ohmic layer 116. The first conductivity-type semiconductor layer 110 may be an n-type semiconductor layer, and the second conductivity-type semiconductor layer 114 may be a p-type semiconductor layer. Alternatively, the first conductivity-type semiconductor layer 110 may be a p-type semiconductor layer, and the second conductivity-type semiconductor layer 114 may be an n-type semiconductor layer.

According to an exemplary embodiment, the first conductivity-type semiconductor layer 110 of each of the light emitting cells LEC_1 and LEC_2 may be electrically coupled with the second light shielding layer 145 through a through electrode VE. As described above, since the second light shielding layer 145 includes metal, such as Ti, Ni, Al, Ag and Cr, the second light shielding layer 145 may function as an electrode. More particularly, current may be supplied to first conductivity-type semiconductor layers 110 through the second light shielding layer 145, and the second light shielding layer 145 may function as a common pad, which supplies current to the first conductivity-type semiconductor layers 110.

According to an exemplary embodiment, since light generated from the two neighboring light emitting cells LEC_1 and LEC_2, for example, a first light emitting cell LEC_1 and a second light emitting cell LEC_2, may not be mixed with each other due to the presence of the first light shielding layer 140 and the second light shielding layer 145, the light emitting device may have excellent color reproducibility. Moreover, because the first light shielding layer 140 is disposed on the first surface 102 of the substrate 100 and the second light shielding layer 145 is disposed on the second surface 104 of the substrate 100, it is possible to prevent the substrate 100 having a thin thickness from being damaged by an external shock. Further, as the second light shielding layer 145 includes metal, the second light shielding layer 145 may function as a common pad, which supplies current to the first conductivity-type semiconductor layers 110.

According to an exemplary embodiment, since the second light shielding layer 145 selectively exposes the light emitting areas EA and shields the other portion as illustrated in FIG. 8B, light generated from the light emitting cells LEC_1 and LEC_2 may be emitted by passing through the light emitting areas EA, each of which is smaller than the corresponding cell area CA. As such, light generated from the light emitting cells LEC_1 and LEC_2 may be emitted by being concentrated in the light emitting areas EA. In this manner, the light emitting device may have an excellent contrast.

The light emitting device may further include pads 120, which are respectively disposed on ohmic layers 116. Each of the pads 120 may include metal, such as Ti, Ni, Al, Ag, and Cr. The pads 120 may provide current to the second conductivity-type semiconductor layers 114 through the ohmic layers 116.

In some exemplary embodiments, rough structures PT may be formed in the light emitting areas EA of the second surface 104 of the substrate 100, which are exposed by the second light shielding layer 145. In this manner, light emitted through each light emitting area EA, which is smaller than each of the light emitting cells LEC_1 and LEC_2, may be scattered by the rough structure PT, such that the light emitting device may have an improved light extraction effect.

Since the substrate 100, the first concave part 106, the second concave part 108, the first light shielding layer 140, the second light shielding layer 145, and the plurality of light emitting cells LEC_1 and LEC_2 illustrated in FIGS. 8A to 8C are substantially the same as those of the substrate 100, the first concave part 106, the second concave part 108, the first light shielding layer 140, the second light shielding layer 145, and the plurality of light emitting cells LEC_1 and LEC_2 described above with reference to FIGS. 7A to 7C, repeated descriptions thereof will be omitted.

Figure 9B:
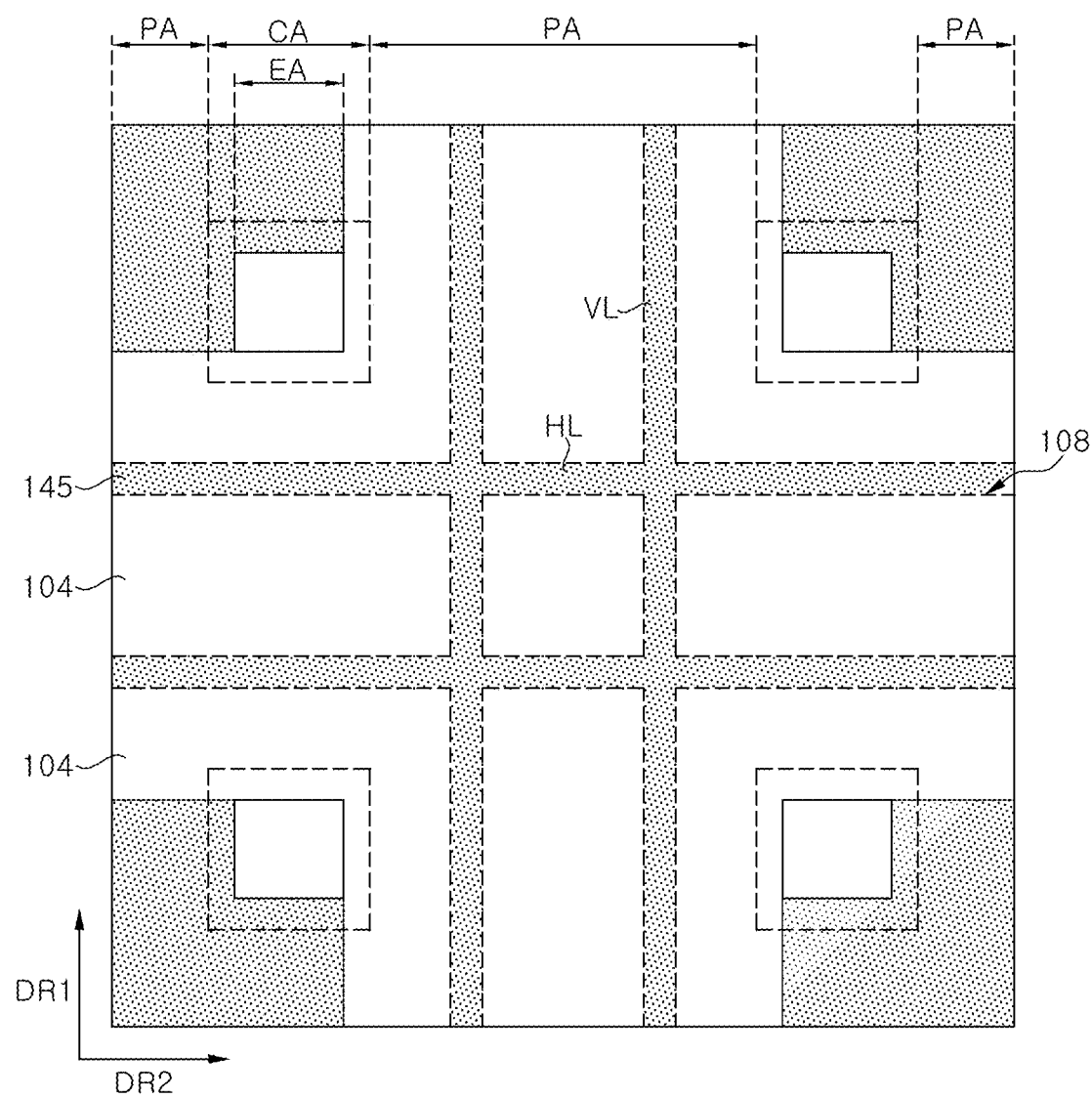
Figure 9C:
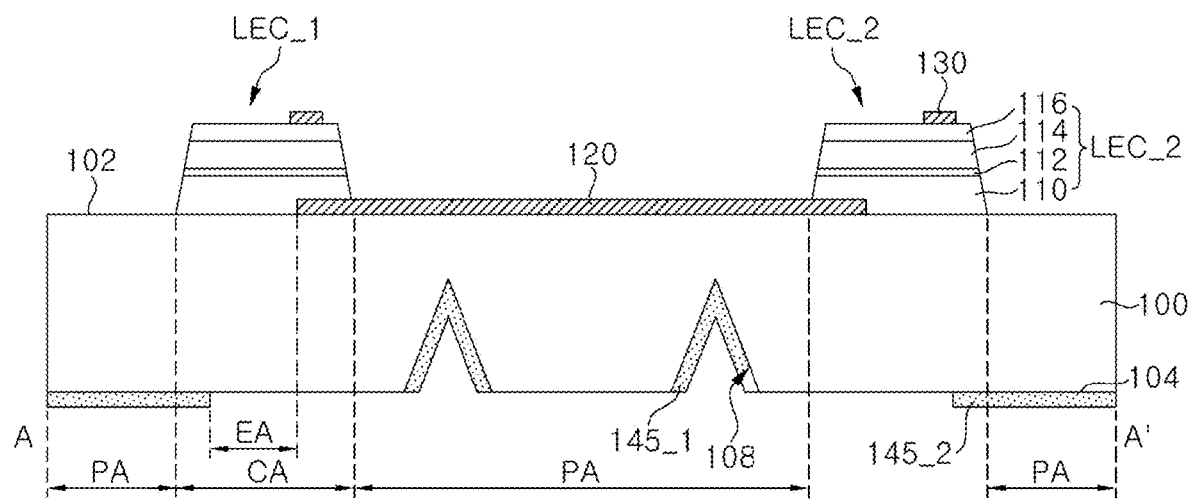
FIG. 9C is a cross-sectional view taken along line A-A' of FIG. 9A.

FIGS. 9A and 9B are schematic top views of a light emitting device according to an exemplary embodiment, and FIG. 9C is a cross-sectional view taken along line A-A' of FIG. 9A. FIG. 9A is a top view obtained when viewing the light emitting device from one side, for example, a position where pads are disposed, and FIG. 9B is a top view obtained when viewing the light emitting device from the opposing side, for example, a light emitting surface.

Referring to FIGS. 9A to 9C, a light emitting device may include a substrate 100, a plurality of light emitting cells LEC_1 and LEC_2 disposed on a first surface 102 of the substrate 100, a first pad 120 and second pads 130 disposed on the first surface 102 of the substrate 100 and are electrically coupled with the plurality of light emitting cells LEC_1 and LEC_2, and a light shielding layer 140 disposed on a second surface 104 of the substrate 100 opposing the first surface 102.

The substrate 100 may include cell areas CA, where the light emitting cells LEC_1 and LEC_2 are disposed, and a peripheral area PA excluding the cell areas CA. Each of the cell areas CA may include a light emitting area EA, which is smaller than the corresponding cell area CA.

Each of the light emitting cells LEC_1 and LEC_2 may include a first conductivity-type semiconductor layer 110, an active layer 112, a second conductivity-type semiconductor layer 114 and an ohmic layer 116, which are vertically stacked. The first pad 120 may electrically couple first conductivity-type semiconductor layers 110 in common. The first pad 120 may supply current to the first conductivity-type semiconductor layers 110. For example, the first pad 120 may include metal, such as Ti, Ni, Al, Ag, Cr, Au and Cu.

According to an exemplary embodiment, the first pad 120 may be disposed between the first conductivity-type semiconductor layers 110 and the first surface 102 of the substrate 100. The first pad 120 may be disposed on the center portion of the substrate 100, cover portions of the cell areas CA, and expose respective light emitting areas EA. Light generated from the light emitting cells LEC_1 and LEC_2 may be shielded, reflected, or absorbed at the portions of the cell areas CA covered by the first pad 120, and may be radiated toward the substrate 100 through the light emitting areas EA. As such, the first pad 120 may function as a light shielding layer.

When viewed from the top, the substrate 100 may have substantially a quadrangular structure, and the light emitting cells LEC_1 and LEC_2 may be disposed at respective corners of the substrate 100 while being separated from the edges of the substrate 100. For example, the first pad 120 may have substantially a cross-shaped structure, which exposes the respective corners of the substrate 100. In this case, the first pad 120 may expose not only the light emitting areas EA but also portions of the substrate 100 disposed between the light emitting areas EA and the respective corners of the substrate 100. As another example, the first pad 120 may have substantially a quadrangular structure including openings, which expose the light emitting areas EA. In this case, the first pad 120 may selectively expose only the light emitting areas EA.

The respective second pads 130 may be disposed while being brought into electrical contact with the respective ohmic layers 116. The second pads 130 may supply current to second conductivity-type semiconductor layers 114 through the ohmic layers 116.

The second surface 104 of the substrate 100 may include a concave part 108, which is recessed from the second surface 104 to the inside of the substrate 100. The concave part 108 may include vertical parts VL extending in a first direction DR1 and are parallel to each other, and horizontal parts HL extending in a second direction DR2 and are parallel to each other. In some exemplary embodiments, the vertical parts VL and the horizontal parts HL of the concave part 108 may cross with each other.

While the concave part 108 according to the illustrated exemplary embodiment is described as having the structure described above with reference to FIG. 1C, however, in some exemplary embodiments, the concave part 108 may have one of the structures of the concave part 108 described above with reference to FIGS. 1D to 1F, without being limited thereto.

The light shielding layer 145 may be disposed on the second surface 104 of the substrate 100. According to an exemplary embodiment, the light shielding layer 145 may include a first portion 145_1 that fills at least a portion of the concave part 108, and second portions 145_2 disposed at corners on the second surface 104 of the substrate 100, respectively, to expose the light emitting areas EA.

While the first portion 145_1 of the light shielding layer 145 according to the illustrated exemplary embodiment is described as having the structure of FIG. 2A, however, in some exemplary embodiments, the light shielding layer 145 may have one the structures of the light shielding layer 140 described above with reference to FIGS. 2B to 2D, without being limited thereto.

The second portions 145_2 of the light shielding layer 145 may be disposed in correspondence to portions of the substrate 100 where the first pad 120 is not formed, and may expose the light emitting areas EA. Each of the second portions 145_2 may have substantially an L-shaped structure in a plan view. According to another exemplary embodiment, as illustrated in FIG. 7B, the light shielding layer 145 may have a structure, which selectively exposes the light emitting areas EA and covers the entirety of the other portion.

Light generated from the light emitting cells LEC_1 and LEC_2 may be reflected, shielded, or absorbed by the first portion 145_1 of the light shielding layer 145. As such, light of the light emitting cells LEC_1 and LEC_2 may be prevented from being mixed, thereby improving the color reproducibility of the light emitting device.

The second portions 145_2 of the light shielding layer 145 may cover portions of the peripheral area PA and the cell areas CA that not covered by the first pad 120, thereby defining the light emitting areas EA. Each of the light emitting areas EA may be smaller than each of the cell areas CA. As such, light generated from the light emitting cells LEC_1 and LEC_2 may be emitted by being selectively concentrated through the light emitting areas EA. Accordingly, the light emitting device may exhibit an excellent contrast.

Since the substrate 100, the concave part 108, the light shielding layer 145, and the plurality of light emitting cells LEC_1 and LEC_2 illustrated in FIGS. 9A to 9C are substantially the same as those for the substrate 100, the second concave part 108, the second light shielding layer 145, and the plurality of light emitting cells LEC_1 and LEC_2 described above with reference to FIGS. 8A to 8C, repeated descriptions thereof will be omitted.

Figure 10A:
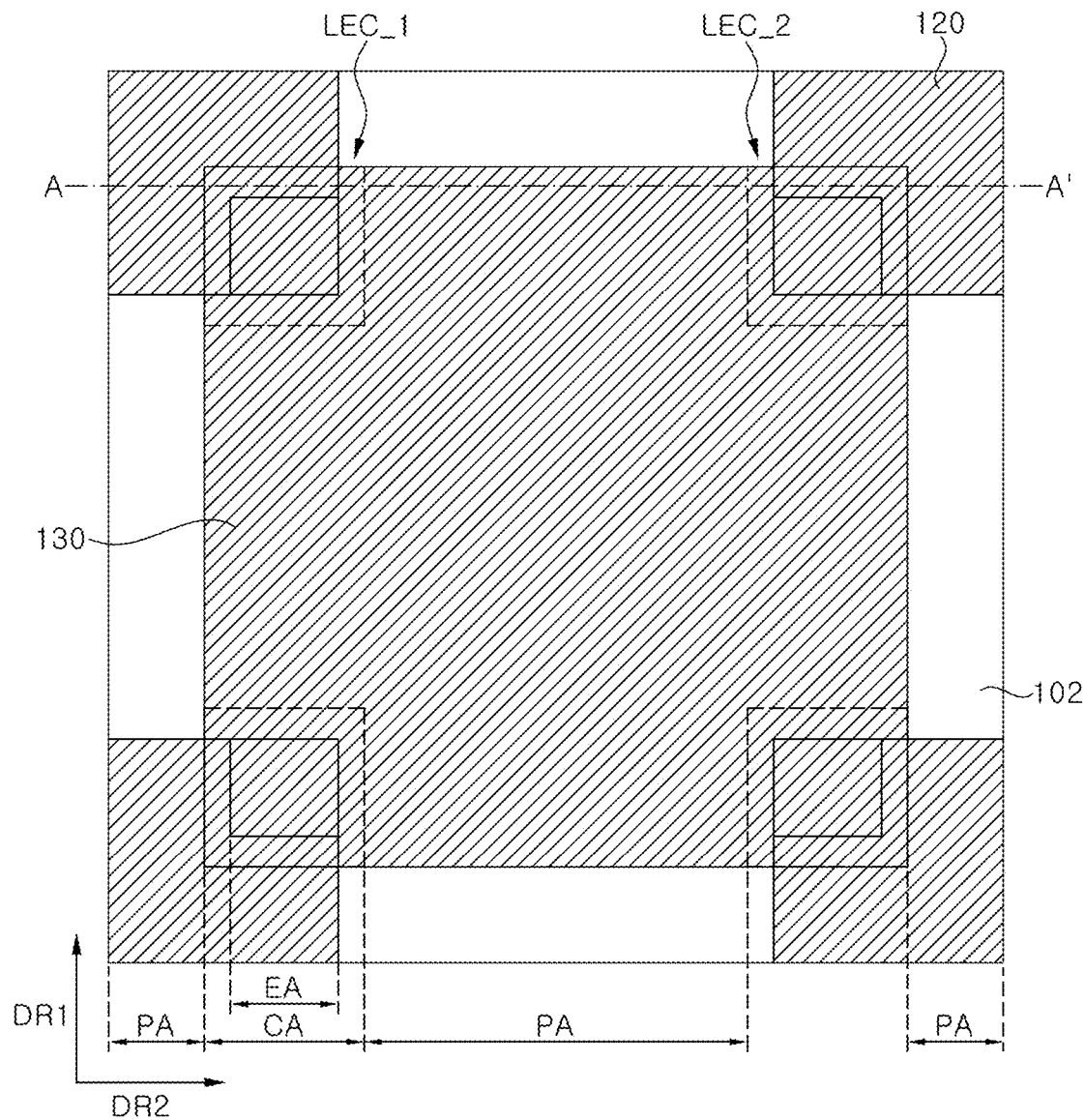
FIGS. 10A and 10B are schematic top views of a light emitting device according to another exemplary embodiment.
Figure 10B:
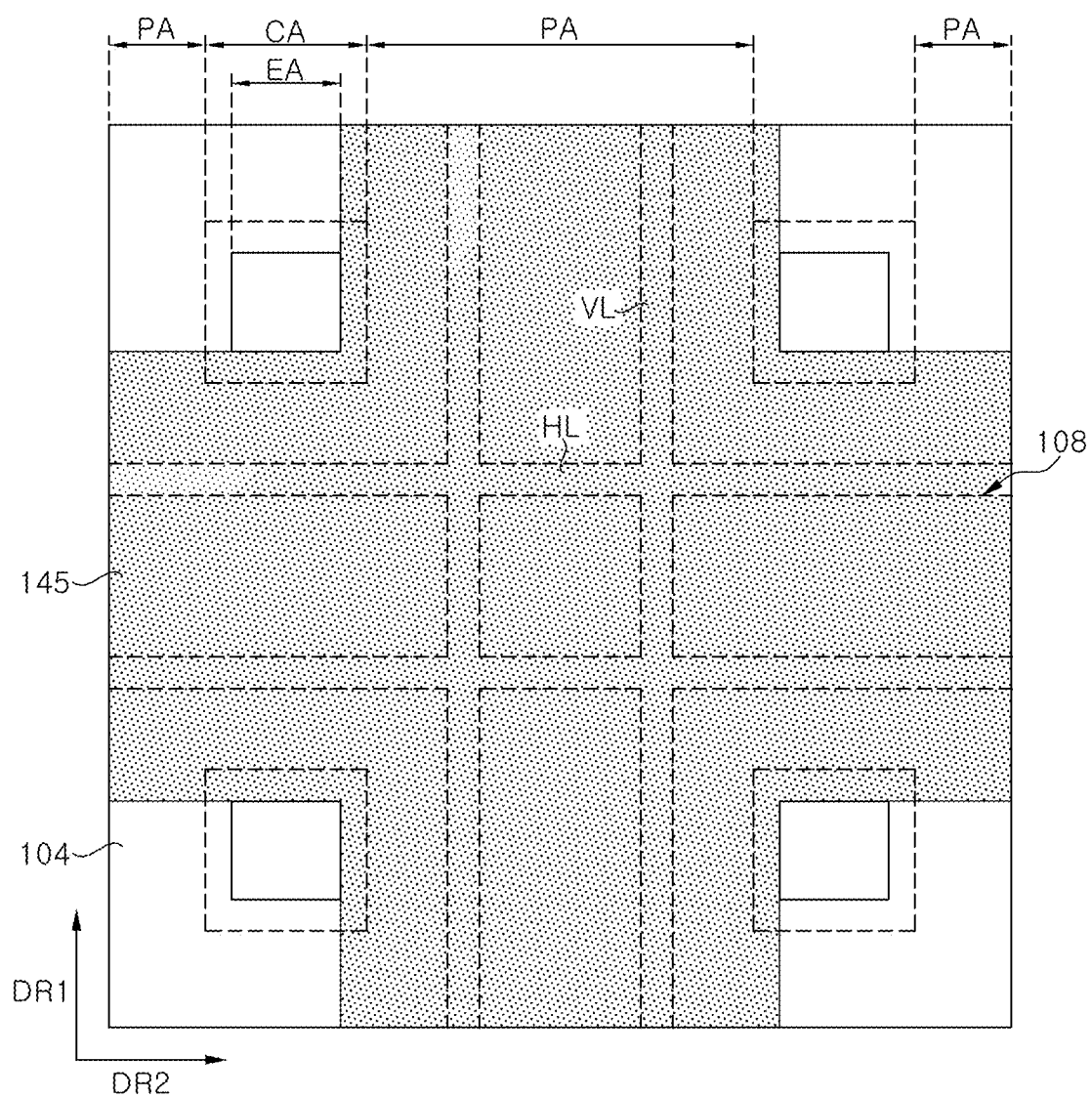
Figure 10C:
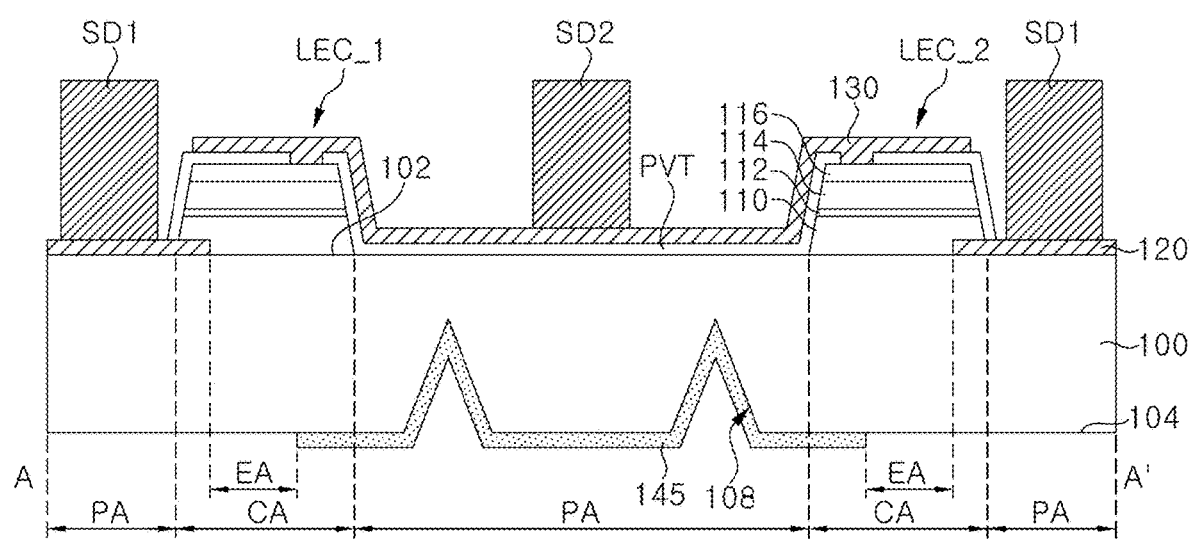
FIG. 10C is a cross-sectional view taken along line A-A' of FIG. 10A.

FIGS. 10A and 10B are schematic top views of a light emitting device according to another exemplary embodiment, and FIG. 10C is a cross-sectional view taken along line A-A' of FIG. 10A. FIG. 10A is a top view obtained when viewing the light emitting device from one side, and FIG. 10B is a top view obtained when viewing the light emitting device from the opposing side.

Referring to FIGS. 10A to 10C, a light emitting device may include a substrate 100, a plurality of light emitting cells LEC_1 and LEC_2 disposed on a first surface 102 of the substrate 100, first pads 120 and a second pad 130 disposed on the first surface 102 of the substrate 100 and are electrically coupled with the light emitting cells LEC_1 and LEC_2, and a light shielding layer 145 disposed on a second surface 104 of the substrate 100 opposing the first surface 102.

The substrate 100 may include cell areas CA, where the light emitting cells LEC_1 and LEC_2 are disposed, and a peripheral area PA excluding the cell areas CA. Each of the cell areas CA may include a light emitting area EA, which is smaller than each cell area CA.

When viewed from the top, the substrate 100 may have substantially a quadrangular structure, and the light emitting cells LEC_1 and LEC_2 may be disposed at respective corners of the substrate 100 by being separated from the edges of the substrate 100.

Each of the light emitting cells LEC_1 and LEC_2 may include a first conductivity-type semiconductor layer 110, an active layer 112, a second conductivity-type semiconductor layer 114, and an ohmic layer 116, which are vertically stacked. The first pads 120 may be electrically coupled with respective first conductivity-type semiconductor layer 110. The first pads 120 may supply current to the respective first conductivity-type semiconductor layer 110. For example, the first pads 120 may include metal, such as Ti, Ni, Al, Ag, Cr, Au, and Cu.

According to an exemplary embodiment, each of the first pads 120 may be disposed between the corresponding first conductivity-type semiconductor layer 110 and the first surface 102 of the substrate 100. The first pads 120 may be disposed at the respective corners of the substrate 100 to expose light emitting areas EA. For example, each of the first pads 120 may have substantially an L-shaped structure in a plan view.

The first pads 120 may cover portions of the cell areas CA and expose the light emitting areas EA. Light generated from the light emitting cells LEC_1 and LEC_2 may be shielded, reflected, or absorbed at portions of the substrate 100 covered by the first pads 120, and may be radiated toward the substrate 100 through the light emitting areas EA. As such, each of the first pads 120 may function as a light shielding layer.

The second pad 130 may be disposed at the center portion of the substrate 100. The second pad 130 may be electrically coupled with the ohmic layers 116 in common, and may extend to the first surface 102 of the substrate 100. According to an exemplary embodiment, the light emitting device may further include a passivation layer PVT, which is disposed between the first conductivity-type semiconductor layers 110, active layers 112, second conductivity-type semiconductor layers 114, the ohmic layers 116, the substrate 100, and the second pad 130. The second pad 130 may include metal, such as Ti, Ni, Al, Ag, Cr, Au, and Cu, and the passivation layer PVT may include an insulating material, such as $SiO_2$ and SiN. The passivation layer PVT may include openings, which expose at least portions of the ohmic layers 116. The second pad 130 may be electrically coupled with the ohmic layers 116 through the openings.

According to an exemplary embodiment, the second pad 130 may cover the top portions of the respective ohmic layers 116. In this case, some of the light emitted in all directions from the respective active layers 112 may be reflected toward the substrate 100 by the second pad 130.

According to an exemplary embodiment, the respective first pads 120 may overlap with portions of the second pad 130. The respective first pads 120 may cover the portions of the cell areas CA and expose the light emitting areas EA, and the second pad 130 may cover the cell areas CA including the light emitting areas EA.

The light shielding layer 145 may fill at least a portion of a concave part 108, which is formed in the second surface 104 of the substrate 100. While the concave part 108 is illustrated as having the structure described above with reference to FIG. 1C, however, in some exemplary embodiments, the concave part 108 may have one the structures of the concave part 106 described above with reference to FIGS. 1D, 1E and 1F, without being limited thereto. Also, while the light shielding layer 145 is illustrated as having the structure of FIG. 2B, however, in some exemplary embodiments, the light shielding layer 145 may have one of the structures of the light shielding layer 140 described above with reference to FIGS. 2A, 2C and 2D, without being limited thereto.

According to an exemplary embodiment, the light shielding layer 145 may fill the concave part 108 while covering a portion of the second surface 104 of the substrate 100. The light shielding layer 145 may be disposed at the center area of the second surface 104 of the substrate 100. The light shielding layer 145 may be disposed to expose the light emitting areas EA and correspond to an area where the first pads 120 are not disposed. For example, the light shielding layer 145 may have substantially a cross-shaped structure to expose the light emitting areas EA. The light shielding layer 145 may include metal, such as Ti, Ni, Al, Ag, and Cr, or may include a material, such as a photoresist, epoxy, PDMS, and a black matrix.

Light generated from the light emitting cells LEC_1 and LEC_2 may be reflected, shielded, or absorbed by the light shielding layer 145, and light of the light emitting cells LEC_1 and LEC_2 may be prevented from being mixed, thereby improving the color reproducibility of the light emitting device. The light shielding layer 145 may cover portions of the peripheral area PA and the cell areas CA, which are not covered by the first pads 120, thereby defining the light emitting areas EA. Each of the light emitting areas EA may be smaller than each cell area CA. As such, light generated from the light emitting cells LEC_1 and LEC_2 may be emitted by being selectively concentrated through the light emitting areas EA. In this manner, the light emitting device may exhibit excellent contrast.

The light emitting device may further include first solders SD1, which are electrically coupled with the first pads 120, respectively, on the first pads 120, and a second solder SD2, which is electrically coupled with the second pad 130 on the second pad 130.

Since the substrate 100, the concave part 108, the light shielding layer 145, and the plurality of light emitting cells LEC_1 and LEC_2 illustrated in FIGS. 10A to 10C are substantially the same as those of the substrate 100, the concave part 108, the light shielding layer 145, and the plurality of light emitting cells LEC_1 and LEC_2 described above with reference to FIGS. 9A to 9C, repeated descriptions thereof will be omitted.

Figure 11A:
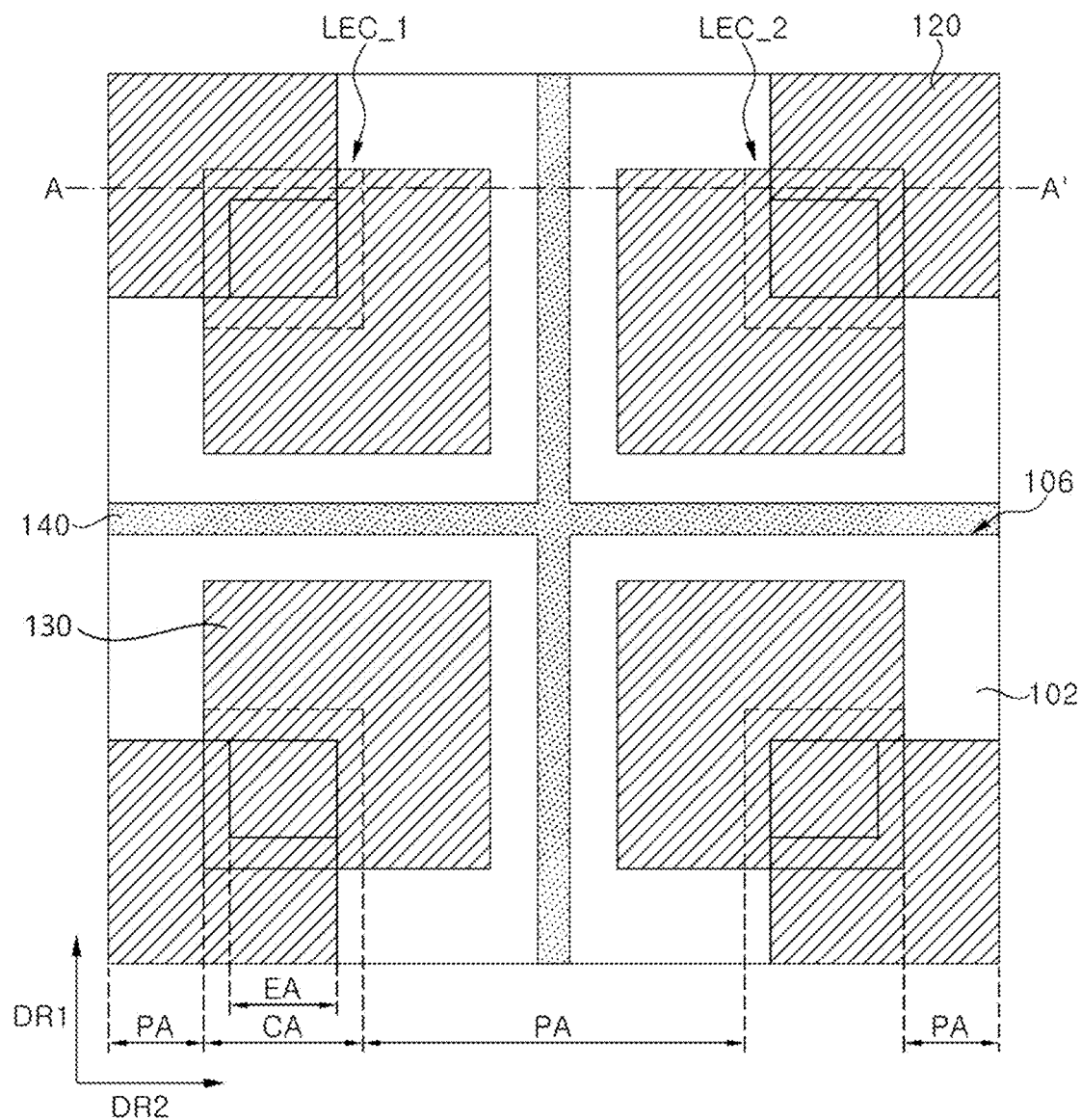
FIG. 11A is a schematic top view of a light emitting device according to another exemplary embodiment.
Figure 11B:
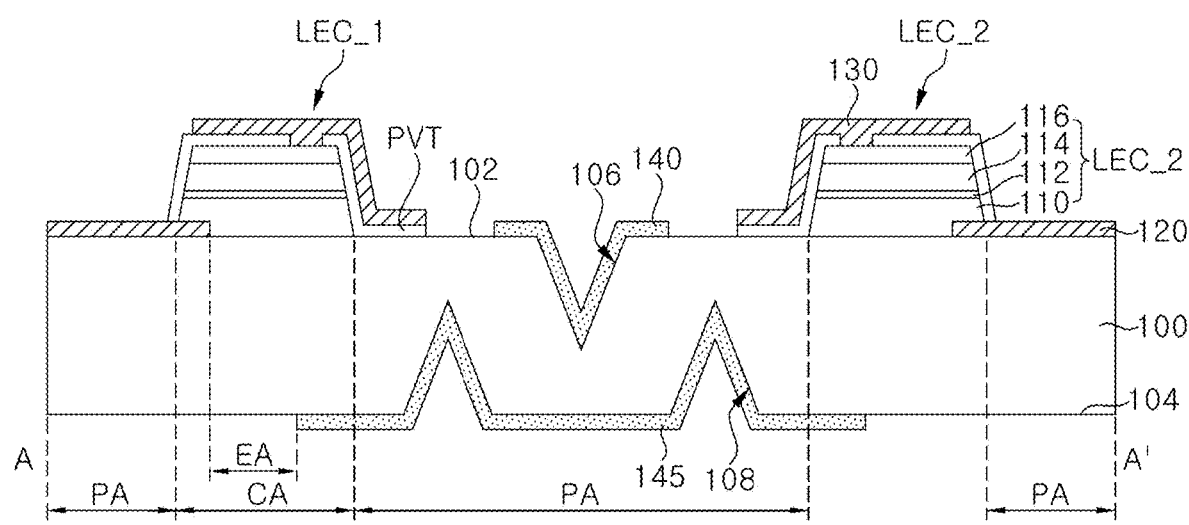
FIG. 11B is a cross-sectional view taken along line A-A' of FIG. 11A.

FIG. 11A is a schematic top view of a light emitting device according to another exemplary embodiment, and FIG. 11B is a cross-sectional view taken along line A-A' of FIG. 11A. FIG. 11A is a top view obtained when viewing the light emitting device from one side, for example, a position where pads are disposed. Since a top view obtained when viewing the light emitting device from the opposing side, for example, a light emitting surface, is substantially the same as FIG. 10B, the top view of the opposing side may be referenced to FIG. 10B.

Referring to FIGS. 10B, 11A and 11B, a light emitting device may include a substrate 100, a plurality of light emitting cells LEC_1 and LEC_2 disposed on a first surface 102 of the substrate 100, first pads 120 and second pads 130 disposed on the first surface 102 of the substrate 100 and are electrically coupled with the light emitting cells LEC_1 and LEC_2, a first light shielding layer 140 disposed on the first surface 102 of the substrate 100 between the light emitting cells LEC_1 and LEC_2, and a second light shielding layer 145 disposed on a second surface 104 of the substrate 100 opposing the first surface 102.

The substrate 100 may include cell areas CA, where the light emitting cells LEC_1 and LEC_2 are disposed, and a peripheral area PA excluding the cell areas CA. Each of the cell areas CA may include a light emitting area EA, which is smaller than each cell area CA.

Each of the light emitting cells LEC_1 and LEC_2 may include a first conductivity-type semiconductor layer 110, an active layer 112, a second conductivity-type semiconductor layer 114, and an ohmic layer 116, which are vertically stacked. The first pads 120 may be disposed between the corresponding first conductivity-type semiconductor layer 110 and the substrate 100. Each of the first pads 120 may be brought into electrical contact with the corresponding first conductivity-type semiconductor layer 110. According to an exemplary embodiment, the substrate 100 may have substantially a quadrangular structure. When the light emitting cells LEC_1 and LEC_2 are respectively disposed at the corners of the substrate 100, the first pads 120 may be respectively disposed at the corners, and may respectively expose light emitting areas EA. Each of the first pads 120 may include metal, such as Ti, Ni, Al, Ag, Cr, Au, and Cu.

The second pads 130 may be electrically coupled with the corresponding ohmic layer 116. In some exemplary embodiments, a passivation layer PVT may be further included, which is disposed between the first conductivity-type semiconductor layers 110, active layers 112, second conductivity-type semiconductor layers 114, the ohmic layers 116, the substrate 100, and the second pads 130. Each of the second pads 130 may include metal, such as Ti, Ni, Al, Ag, Cr, Au, and Cu, and the passivation layer PVT may include an insulating material, such as $SiO_2$ and SiN. The passivation layer PVT may include openings, which respectively expose at least portions of the ohmic layers 116. The respective second pads 130 may be electrically coupled with the respective ohmic layers 116 through the openings.

According to an exemplary embodiment, the respective second pads 130 may cover the top portions of the respective ohmic layers 116. In this case, some of lights emitted in all directions from the respective active layers 112 may be reflected toward the substrate 100 by the second pads 130.

According to an exemplary embodiment, the respective first pads 120 may overlap with the respective second pads 130. The respective first pads 120 may cover portions of the cell areas CA and expose the light emitting areas EA, and the respective second pads 130 may cover the respective cell areas CA including the respective light emitting areas EA.

The first light shielding layer 140 may fill at least a portion of a first concave part 106, which is formed in the first surface 102 of the substrate 100. For example, the first light shielding layer 140 may include metal, such as Ti, Ni, Al, Ag, and Cr, or may include a material, such as a photoresist, epoxy, PDMS, and a black matrix.

While the first concave part 106 is illustrated as having the structure described above with reference to FIG. 1C, however, in some exemplary embodiments, the concave part 106 may have one the structures of the first concave part 106 described above with reference to FIGS. 1D to 1F, without being limited thereto. Also, while the first light shielding layer 140 is illustrated as having the structure of FIG. 2B, however, in some exemplary embodiments, the first light shielding layer 140 may have one of the structures of the light shielding layer 140 described above with reference to FIGS. 2A, 2C and 2D, without being limited thereto.

Since the second light shielding layer 145 is substantially the same as the second light shielding layer 145 described above with reference to FIGS. 10A to 10C, repeated descriptions thereof will be omitted.

Light generated from the light emitting cells LEC_1 and LEC_2 may be reflected, shielded, or absorbed by the first light shielding layer 140 and the second light shielding layer 145, and thus, light of the light emitting cells LEC_1 and LEC_2 may be prevented from being mixed, thereby improving the color reproducibility of the light emitting device. The second light shielding layer 145 may cover portions of the peripheral area PA and the cell areas CA, which are not covered by the first pads 120, thereby defining the respective light emitting areas EA. Each of the light emitting areas EA may be smaller than each cell area CA. As such, light generated from the light emitting cells LEC_1 and LEC_2 may be emitted by being selectively concentrated through the light emitting areas EA. Therefore, the light emitting device may exhibit an excellent contrast.

Since the substrate 100, the first concave part 106, the second concave part 108, the first light shielding layer 140, the second light shielding layer 145, the plurality of light emitting cells LEC_1 and LEC_2, the first pads 120, and the second pads 130 illustrated in FIGS. 11A and 11B are substantially the same as those for the substrate 100, the first concave part 106, the second concave part 108, the first light shielding layer 140, the second light shielding layer 145, the plurality of light emitting cells LEC_1 and LEC_2, the first pads 120, and the second pads 130 described above with reference to FIGS. 6A to 6C, repeated descriptions thereof will be omitted.

Hereinafter, a method for manufacturing a light emitting device according to an exemplary embodiment will be described. In particular, a method for manufacturing the light emitting device illustrated in FIGS. 7A to 7C will be described as an example.

FIGS. 12A to 16A are schematic top views illustrating a method for manufacturing a light emitting device according to an exemplary embodiment, and FIGS. 12B to 16B are cross-sectional views taken along the lines A-A' of FIGS. 12A to 16A.

Figure 12A:
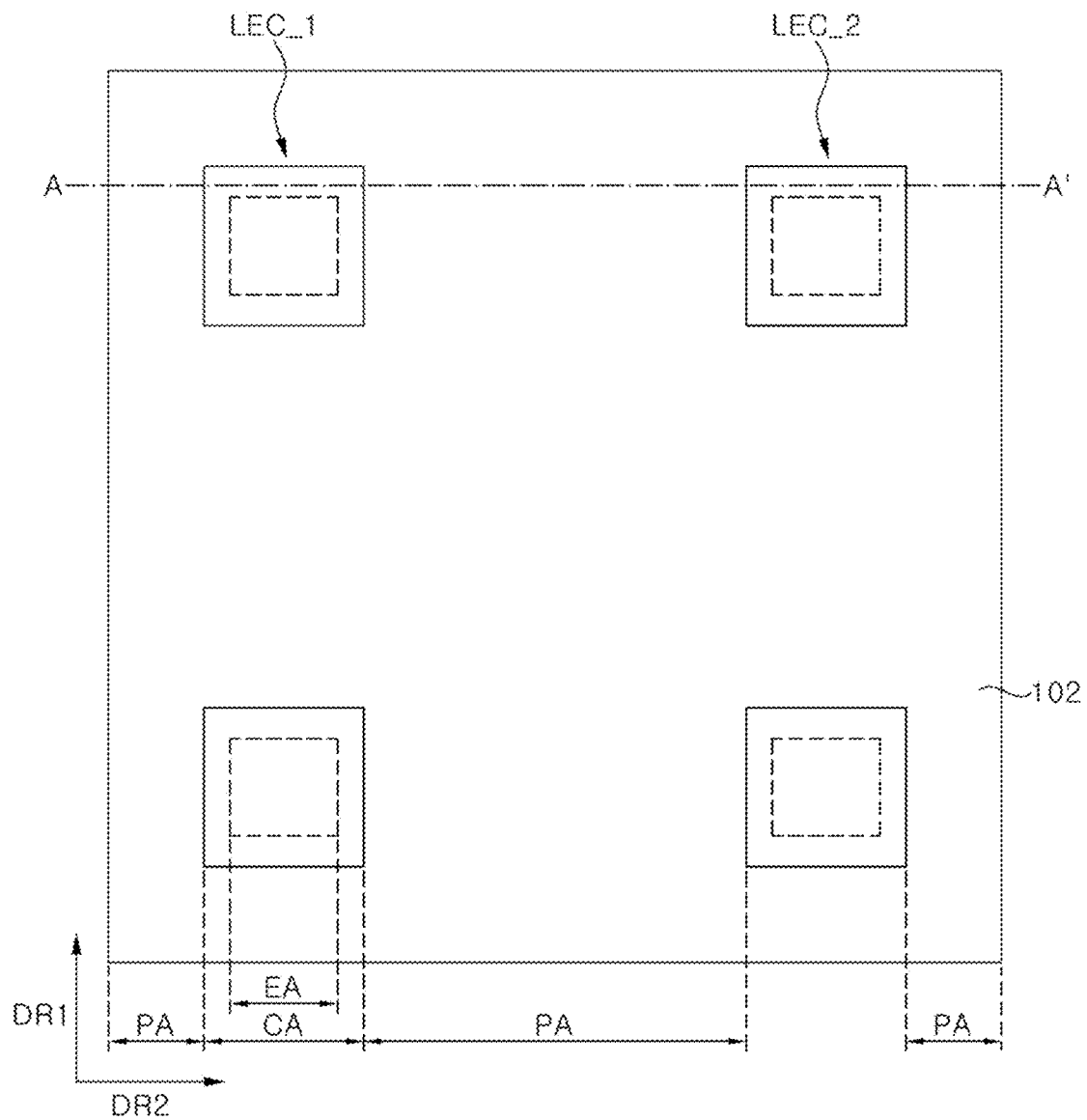
FIGS. 12A, 13A, 14A, 15A, and 16A are top views to illustrate a method for manufacturing a light emitting device according to an exemplary embodiment.
Figure 12B:
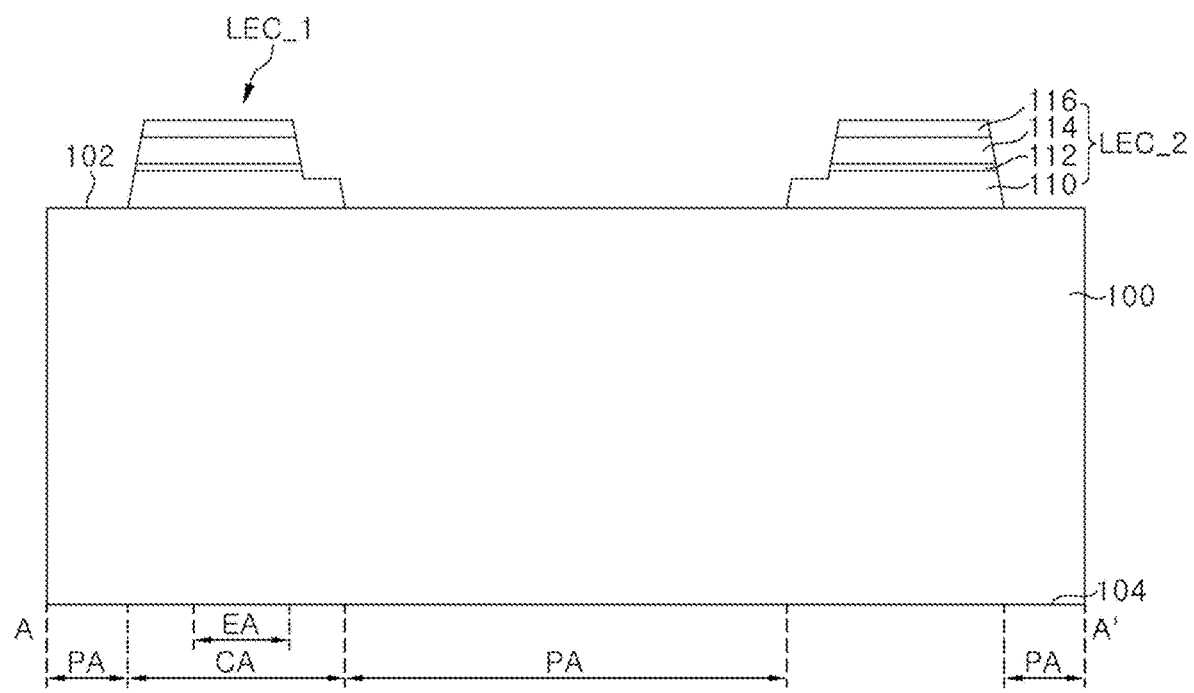
FIGS. 12B, 13B, 14B, 15B, and 16B are cross-sectional views taken along line A-A' of corresponding ones of FIGS. 12A to 16A.

Referring to FIGS. 12A and 12B, cells may be formed on a first surface 102 of a substrate 100.

A first conductivity-type semiconductor layer 110, an active layer 112, and a second conductivity-type semiconductor layer 114 may be formed on the first surface 102 of the first substrate 100 by using a growing method, such as metal organic chemical vapor deposition (MOCVD), molecular beam epitaxy (MBE), hydride vapor phase epitaxy (HYPE), and metal-organic chloride (MOC).

Then, an ohmic layer 116 may be formed on the second conductivity-type semiconductor layer 114 by using a deposition process.

By etching the ohmic layer 116, the second conductivity-type semiconductor layer 114, and the active layer 112, mesa structures exposing portions of the first conductivity-type semiconductor layer 110 may be formed. After forming the mesa structures, the mesa structures may have sloped sidewalls through a reflow process, for example.

By patterning the first conductivity-type semiconductor layer 110, a plurality of light emitting cells LEC_1 and LEC_2 may be formed.

In some exemplary embodiments, in order to form light emitting cells LEC_1 and LEC_2, after an ohmic layer 116 is formed on a first surface of a substrate 100, semiconductor layers formed on other substrates may be sequentially bonded to the ohmic layer 116, which may then be patterned to form the light emitting cells each including a first light emitting part LEC_1_1 or LEC_2_1, a second light emitting part LEC_1_2 or LEC 2_2, and a third light emitting part LEC_1_3 or LEC_2_3.

Figure 13A:
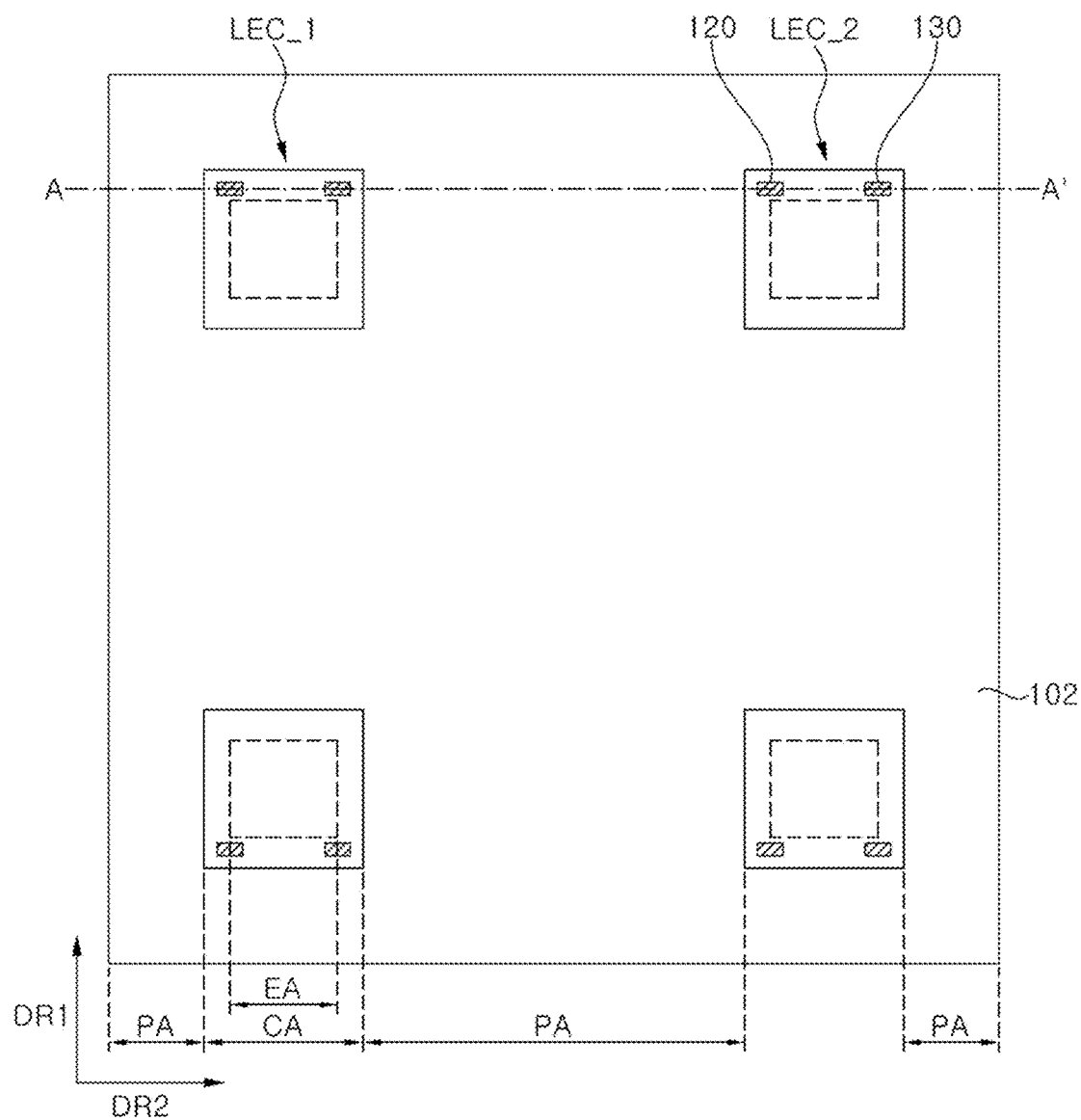
Figure 13B:
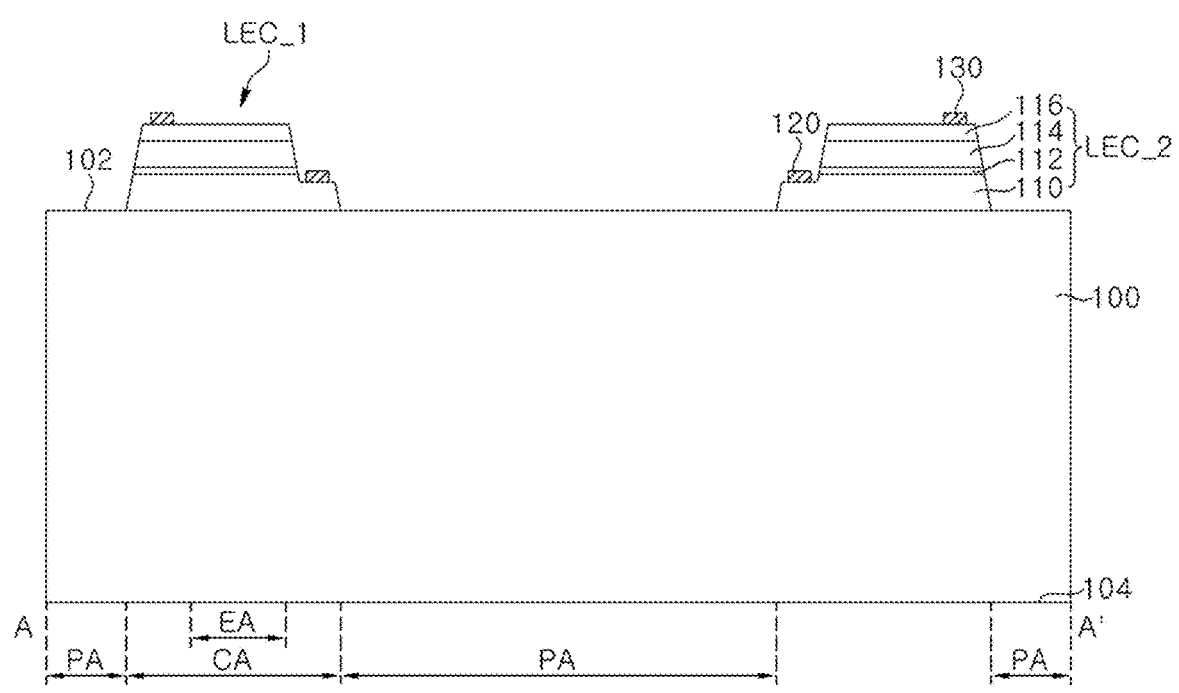

Referring to FIGS. 13A and 13B, first pads 120 electrically coupled with first conductivity-type semiconductor layers 110, respectively, exposed by the mesa structures, and second pads 130 electrically coupled with ohmic layers 116, respectively, may be formed.

A pad layer may be conformally formed on the substrate 100, which is formed with the plurality of light emitting cells LEC_1 and LEC_2, through a deposition process generally known in the art. The pad layer may include at least one of Ti, Ni, Al, Ag, Cr, Au, and Cu. By pattering the pad layer, the first pads 120 may be respectively formed on the first conductivity-type semiconductor layers 110, and the second pads 130 may be respectively formed on the ohmic layers 116.

Figure 14A:
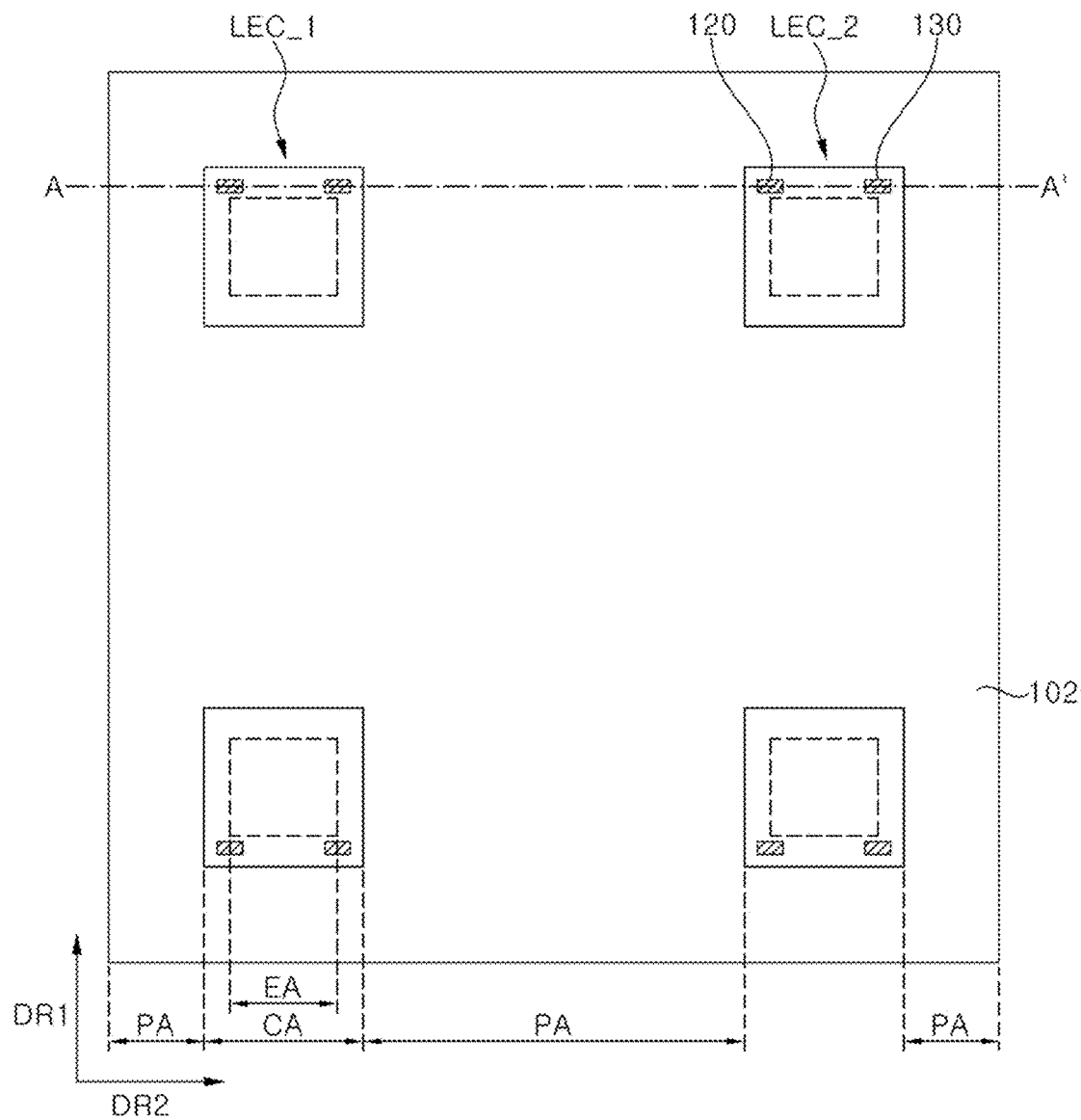
Figure 14B:
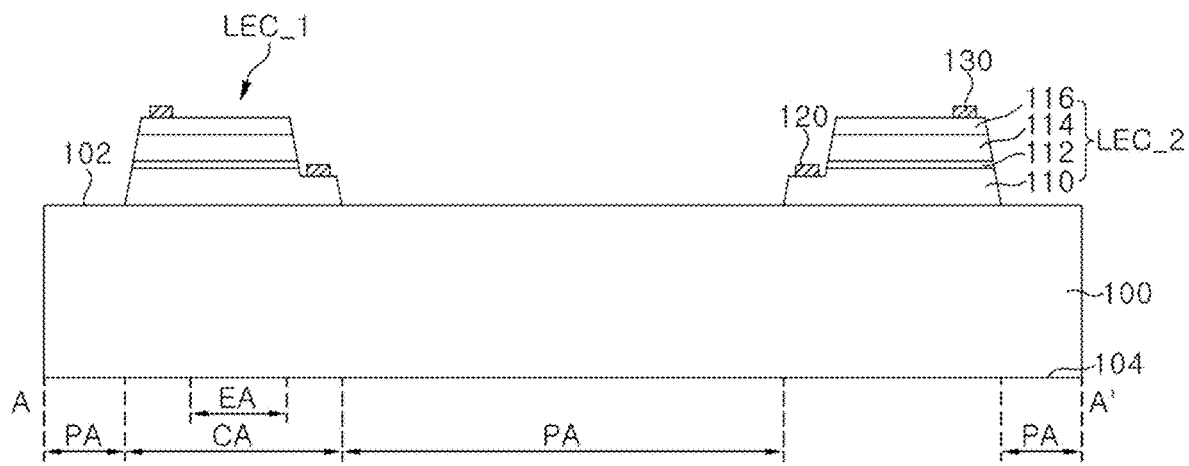

Referring to FIGS. 14A and 14B, by polishing a second surface 104 of the substrate 100 opposing the first surface 102 through a process, such as chemical mechanical polishing or others, the substrate 100 may be formed thin.

Figure 15A:
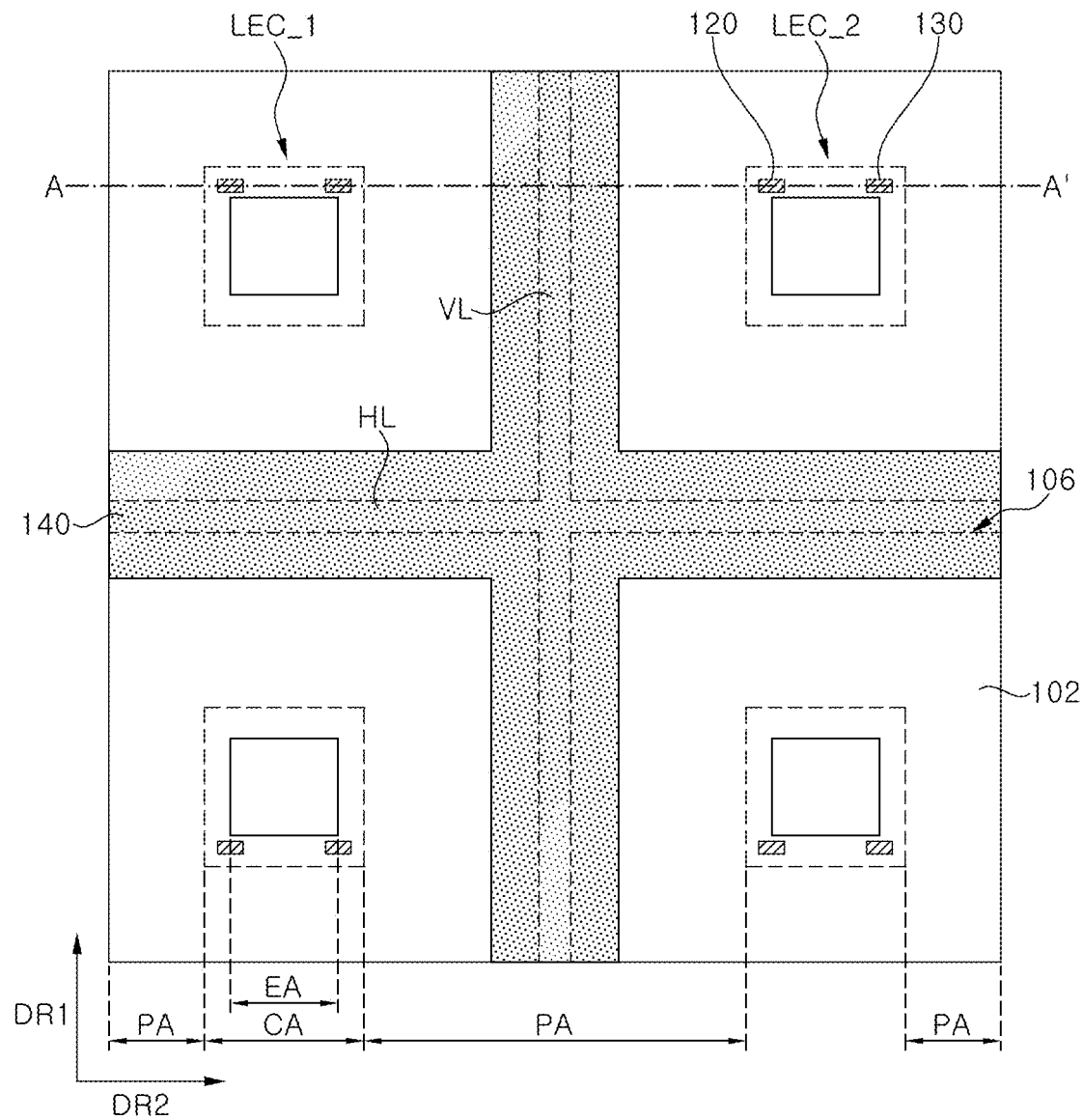
Figure 15B:
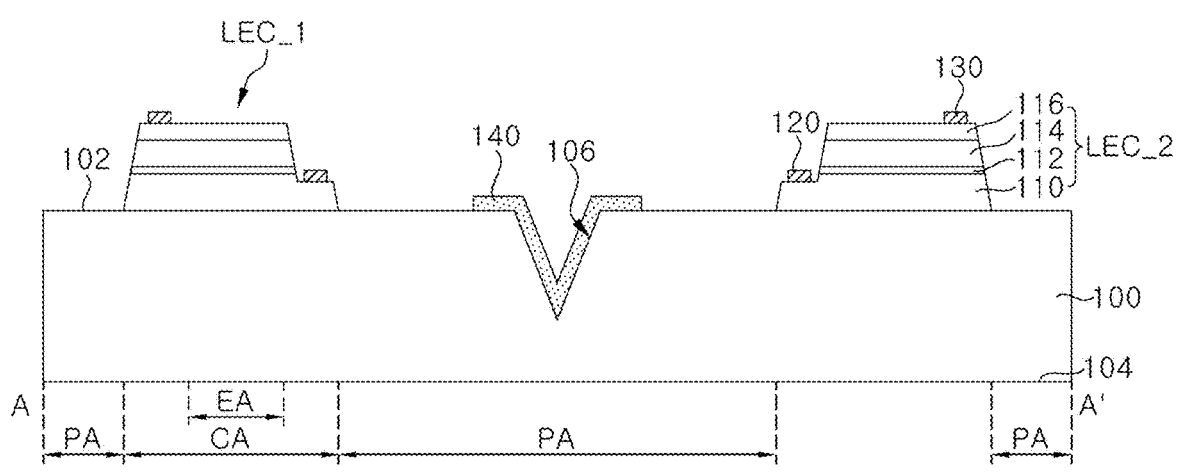

Referring to FIGS. 15A and 15B, a first concave part 106 may be formed in the first surface 102 of the substrate 100. For example, the first concave part 106 may be formed in the first surface 102 of the substrate 100 by a laser process or an etching process.

A first light shielding layer 140, which fills at least a portion of the first concave part 106 may be formed on the first surface 102 of the substrate 100 by a process, such as plating, corrosion, deposition, taping, painting, and screen printing. The first light shielding layer 140 may include metal, such as Ti, Ni, Al, Ag, and Cr, or may include a material, such as a photoresist, epoxy, PDMS, and a black matrix.

According to an exemplary embodiment, through the processes of FIGS. 12A to 15A and 12B to 15B, the light emitting device illustrated in FIGS. 1A and 1B may be formed.

Figure 16A:
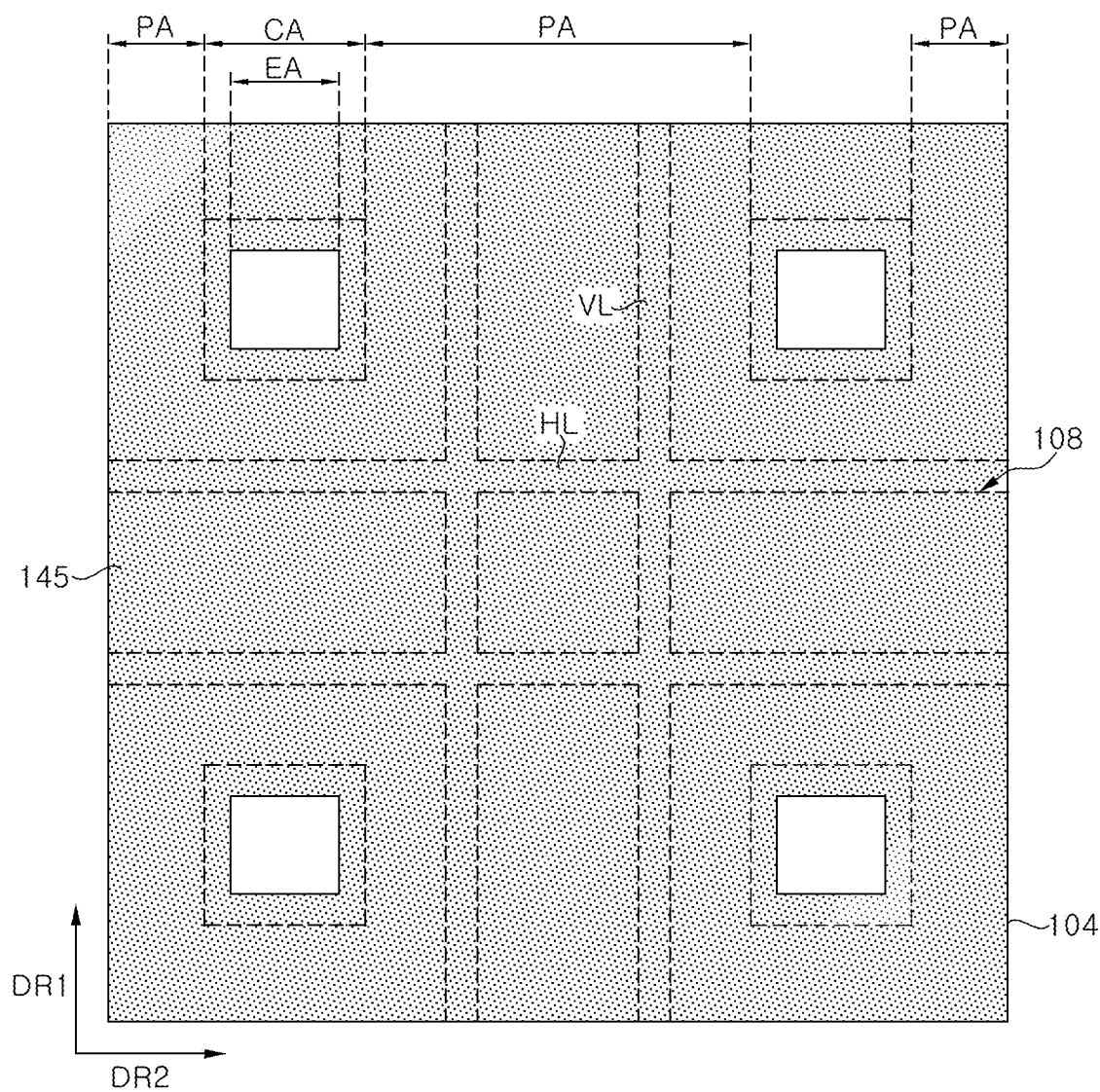
Figure 16B:
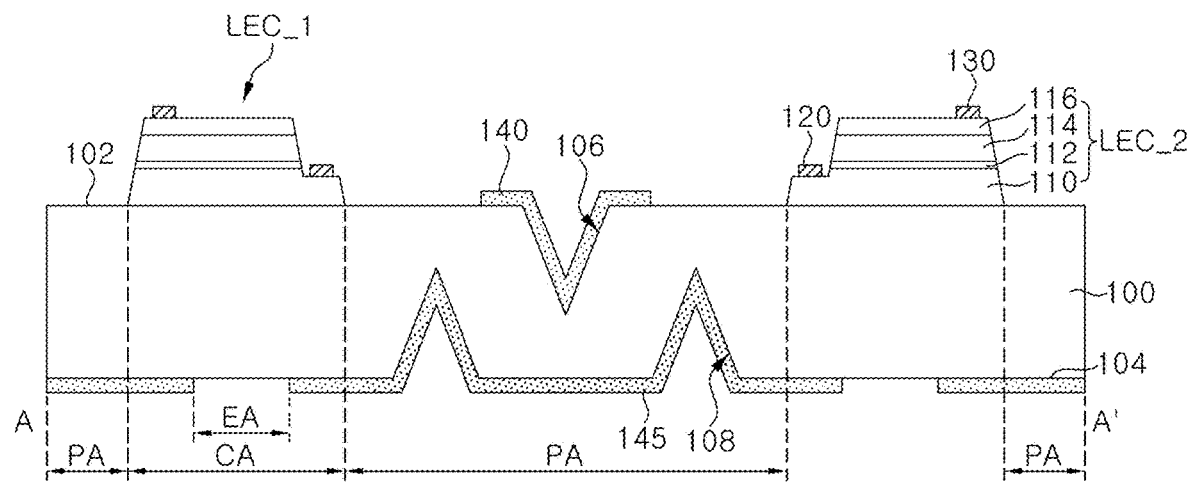

Referring to FIGS. 16A and 16B, a second concave part 108 may be formed in the second surface 104 of the substrate 100. For example, the second concave part 108 may be formed in the second surface 104 of the substrate 100 by a laser process or an etching process.

A second light shielding layer 145, which fills at least a portion of the second concave part 108 and includes openings exposing light emitting areas EA of the substrate 100, may be formed on the second surface 104 of the substrate 100 by a process, such as plating, corrosion, deposition, taping, painting, and screen printing. The second light shielding layer 145 may include metal, such as Ti, Ni, Al, Ag, and Cr, or may include a material, such as a photoresist, epoxy, PDMS, and a black matrix.

While the second concave part 108 and the second light shielding layer 145 are described as being formed after forming the first concave part 106 and the first light shielding layer 140, however, in some exemplary embodiments, the first light shielding layer 140 and the second light shielding layer 145 may be formed after forming the first concave part 106 and the second concave part 108.

In this process, when the second light shielding layer 145 is formed to be retained only in the second concave part 108 through the processes of FIGS. 12A to 16A and 12B to 16B, the light emitting device illustrated in FIGS. 6A and 6B may be formed.

In some exemplary embodiments, referring back to FIGS. 7A and 7B, rough structures PT may be formed on the second surface 104 of the substrate 100 corresponding to the light emitting areas EA. For example, the rough structures PT may be formed on the second surface 104 of the substrate 100 by using a process, such as sandblasting, etching, and grinding.

Hereafter, a method for manufacturing a light emitting device according to another exemplary embodiment will be described. In particular, a method for manufacturing the light emitting device illustrated in FIGS. 10A to 10C will be described as an example.

FIGS. 17A to 19A are schematic top views illustrating a method for manufacturing a light emitting device according to another exemplary embodiment, and FIGS. 17B to 19B are cross-sectional views taken along the lines A-A' of FIGS. 17A to 19A.

Figure 17A:
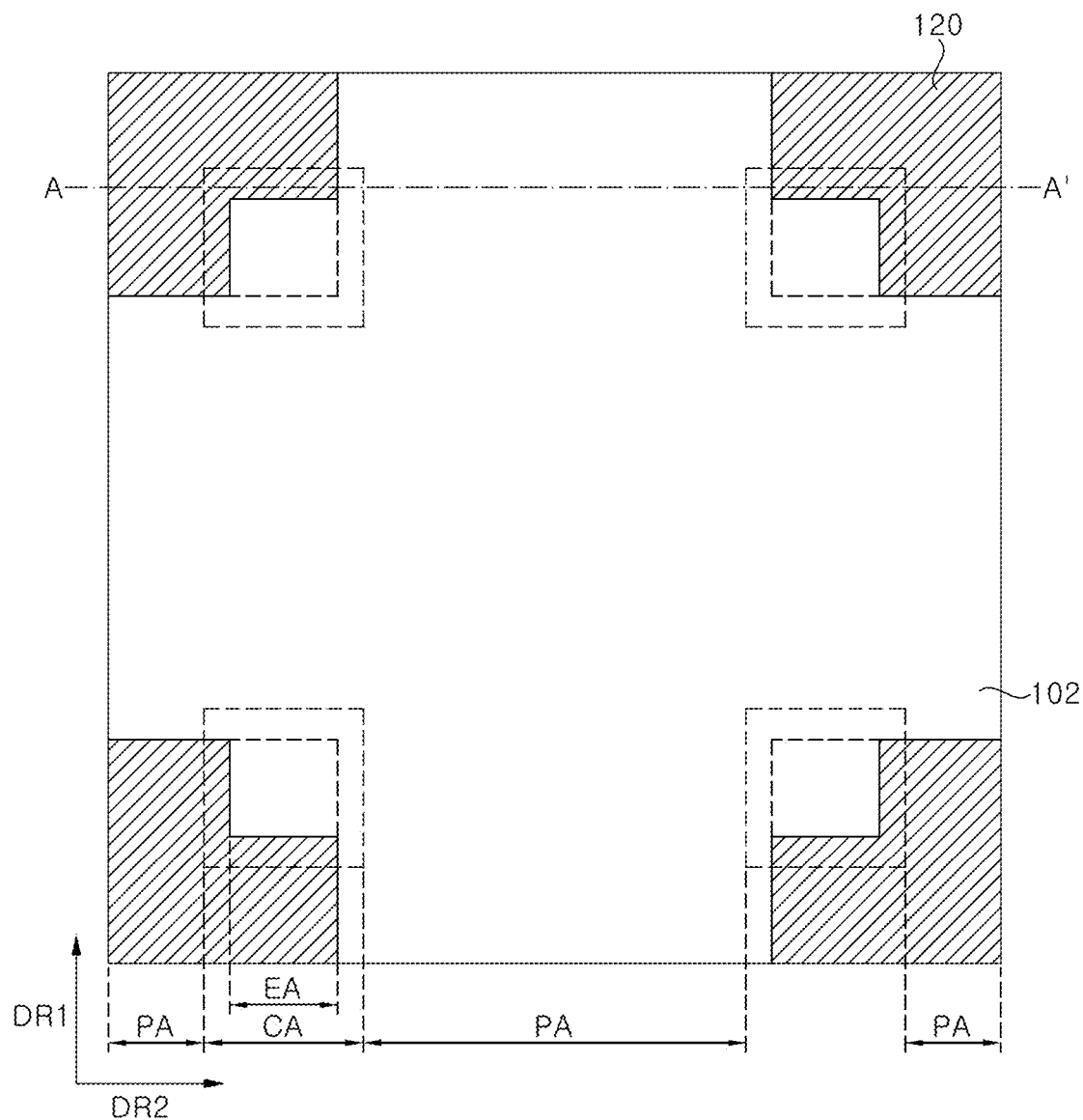
FIGS. 17A, 18A, and 19A are top views to illustrate a method for manufacturing a light emitting device according to another exemplary embodiment.
Figure 17B:
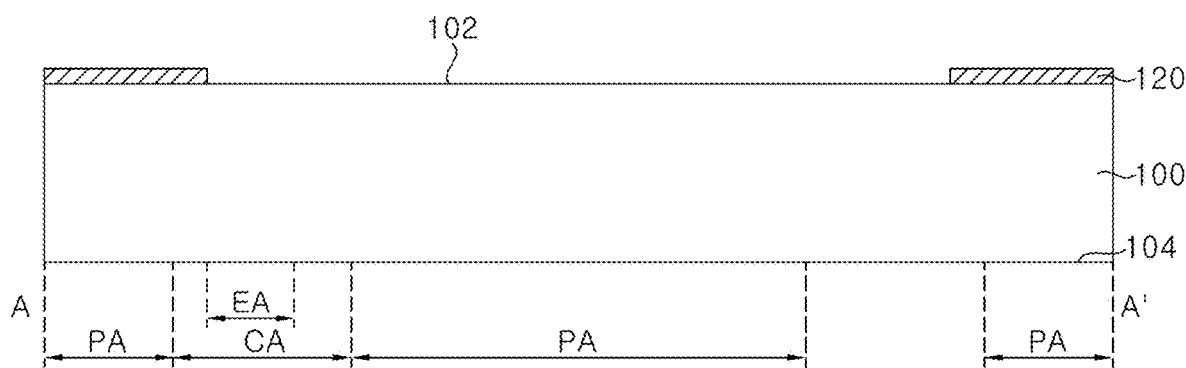
FIGS. 17B, 18B, and 19B are cross-sectional views taken along line A-A' of corresponding ones of FIGS. 17A to 19A.

Referring to FIGS. 17A and 17B, circuit patterns including first pads 120 may be formed on a first surface 102 of a substrate 100.

The substrate 100 may include a plurality of cell areas CA and a peripheral area PA excluding the cell areas CA. The cell areas CA may include light emitting areas EA, each of which is smaller than each cell area CA.

The first pads 120 may be disposed while exposing the light emitting areas EA. For example, when the substrate 100 has substantially a quadrangular structure, the first pads 120 may be disposed at the respective corners of the substrate 100. In order to expose the light emitting areas EA, each of the first pads 120 may have substantially an L-shaped structure in a plan view.

Figure 18A:
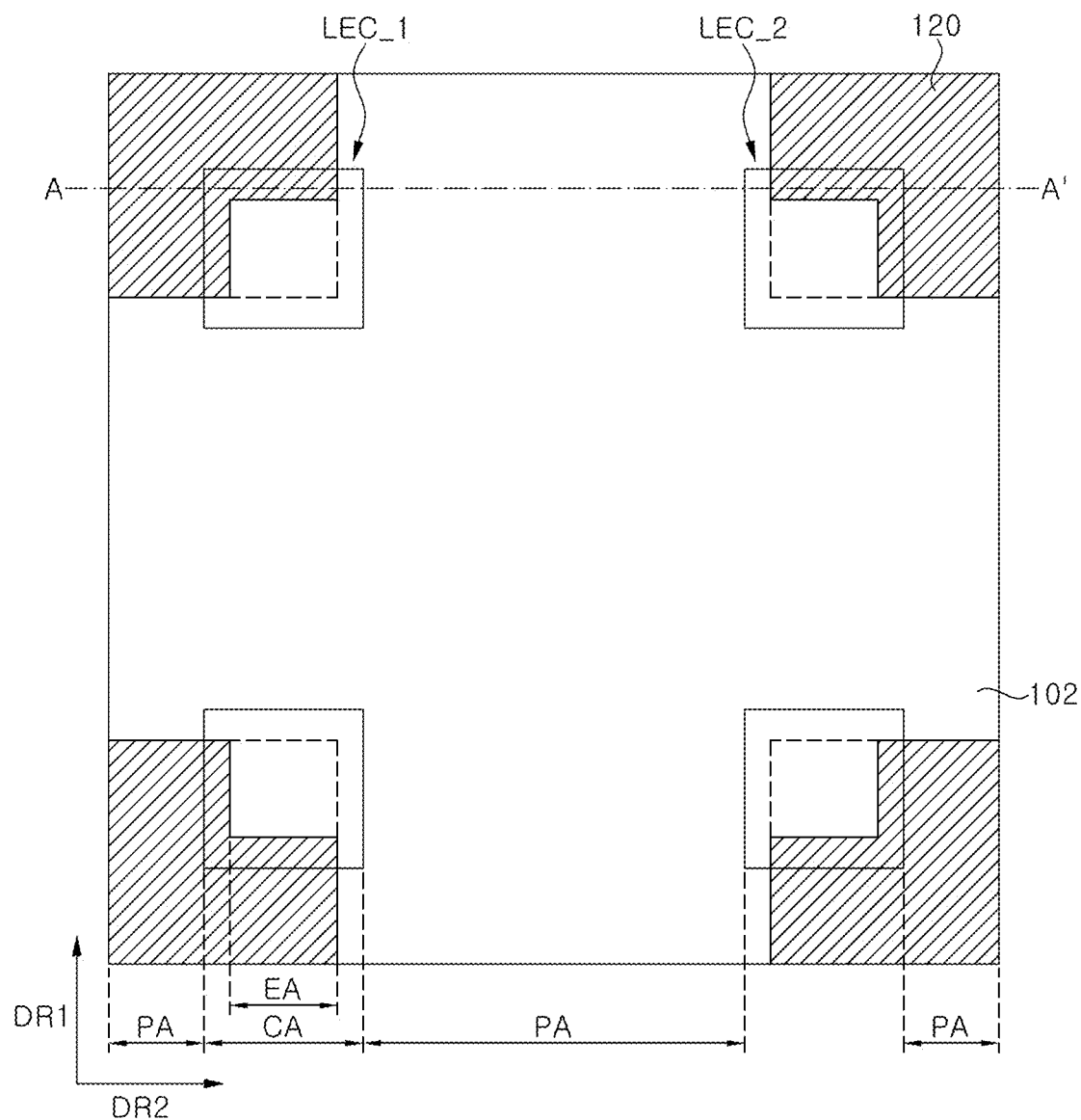
Figure 18B:
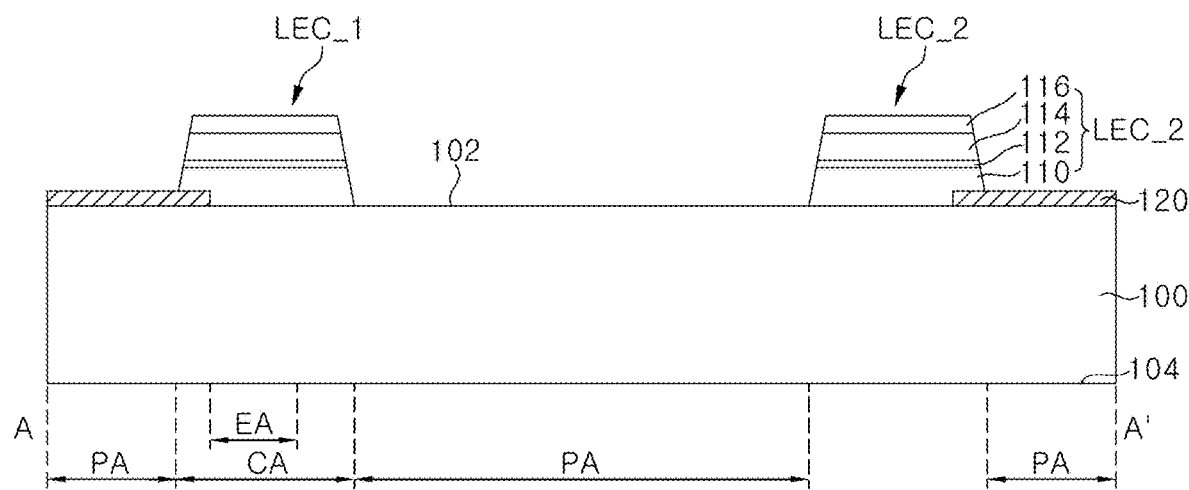

Referring to FIGS. 18A and 18B, after forming a first conductivity-type semiconductor layer 110, an active layer 112, a second conductivity-type semiconductor layer 114, and an ohmic layer 116 on the first surface 102 of the substrate 100 on which the circuit patterns including the first pads 120 are formed, a plurality of light emitting cells LEC_1 and LEC_2 may be formed in the respective cell areas CA by etching, as shown in FIGS. 12A and 12B.

According to an exemplary embodiment, first conductivity-type semiconductor layer 110 of the respective light emitting cells LEC_1 and LEC_2 may be disposed while being brought into electrical contact with the first pads 120. Each of the first pads 120 may include at least one of Ti, Ni, Al, Ag, Cr, Au, and Cu.

According to an exemplary embodiment, the respective first pads 120 may function as a light shielding layer by selectively exposing the light emitting areas EA and covering the other portion.

Figure 19A:
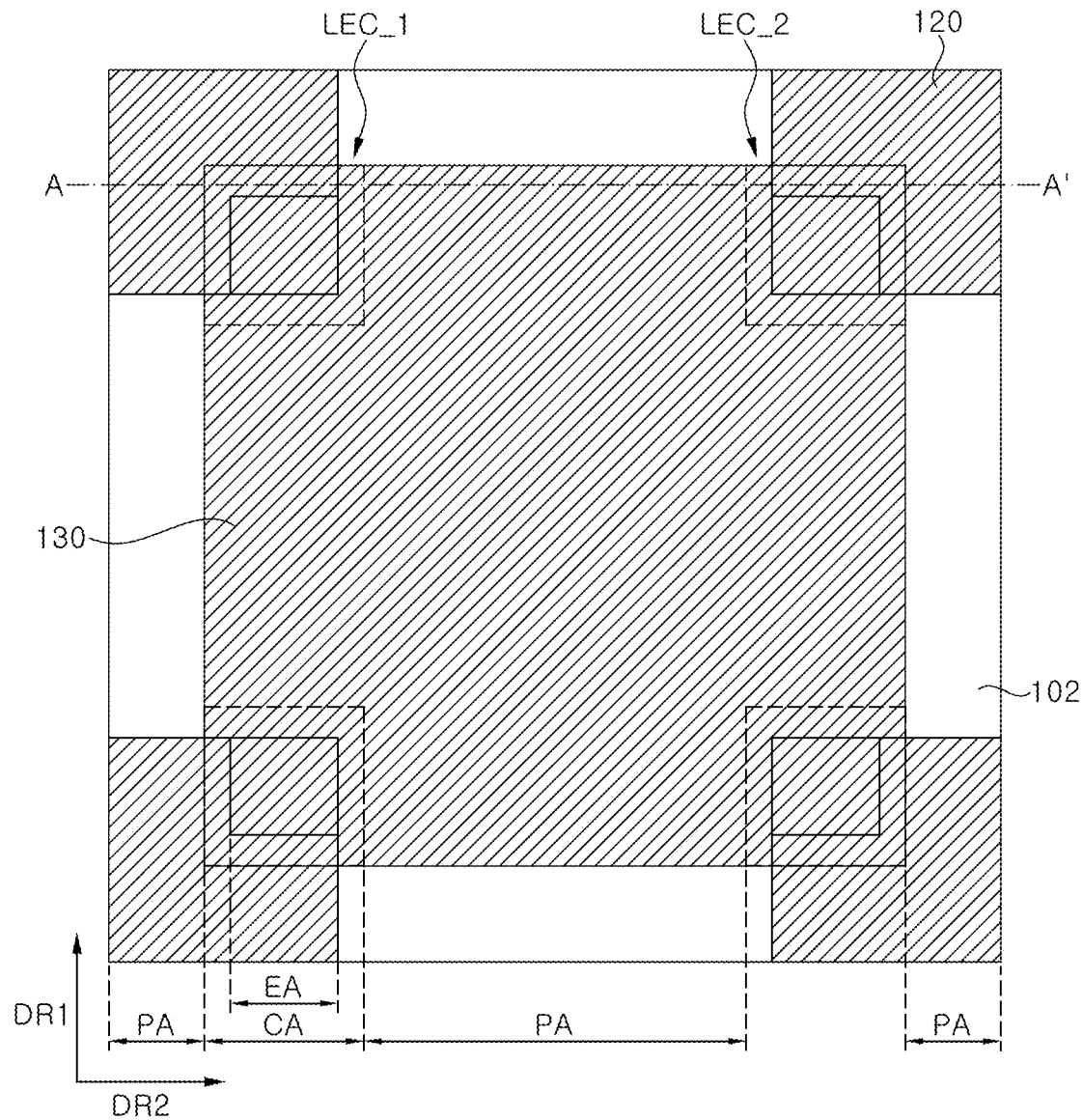
Figure 19B:
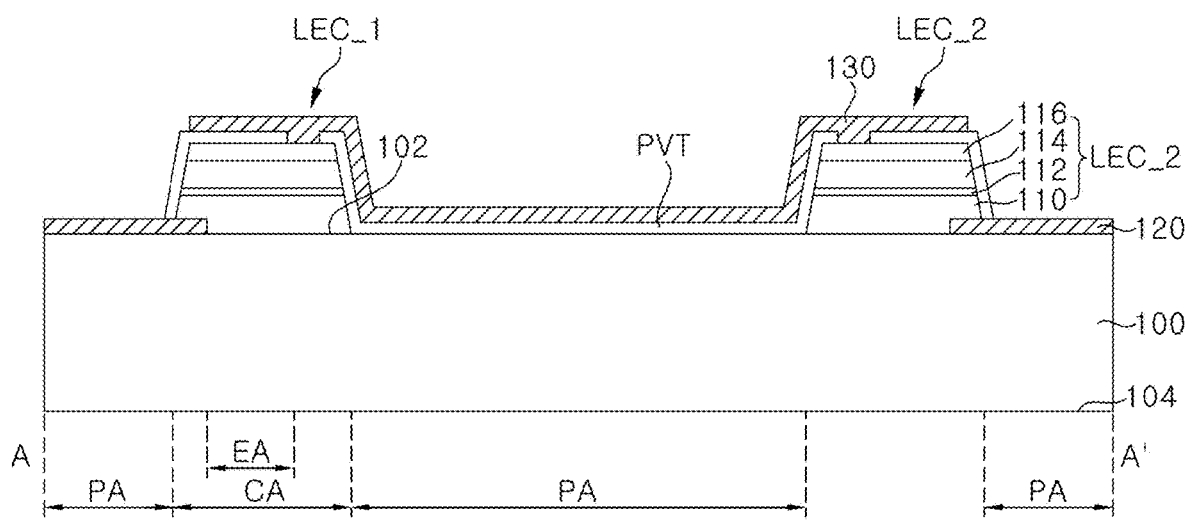

Referring to FIGS. 19A and 19B, a passivation layer PVT may be conformally formed on the light emitting cells LEC_1 and LEC_2, and, by etching the passivation layer PVT, openings exposing portions of ohmic layers 116 may be formed. A second pad 130, which fills the openings and extends onto the first surface 102 of the substrate 100, may be formed on the passivation layer PVT. The second pad 130 may be electrically coupled with the ohmic layers 116 in common.

According to an exemplary embodiment, the second pad 130 may be formed while covering the top surfaces of the respective ohmic layers 116. In this manner, as the second pad 130 covers the top surfaces of the respective ohmic layers 116, light generated from active layers 112 may be reflected toward the substrate 100. While the second pad 130 may cover the light emitting areas EA on the ohmic layers 116, the second pad 130 may expose the respective light emitting areas EA on the first surface 102 of the substrate 100.

Referring back to FIGS. 10A to 10C, a concave part 108 may be formed on a second surface 104 of the substrate 100 opposing the first surface 102, by using a laser process or an etching process. A light shielding layer 145, which fills at least a portion of the concave part 108 and exposes the respective light emitting areas EA, may be formed on the second surface 104 of the substrate 100. The light shielding layer 145 may include metal, such as Ti, Ni, Al, Ag, and Cr, or may include a material, such as a photoresist, epoxy, PDMS, and a black matrix.

By the first pads 120 formed on the first surface 102 of the substrate 100 and the light shielding layer 145 formed on the second surface 104 of the substrate 100, the light emitting areas EA may be defined.

In the light emitting device according to exemplary embodiments, by forming a concave part in a substrate including a plurality of light emitting cells and disposing a light shielding layer, which fills at least partially the concave part, light generated from neighboring light emitting cells may be shielded, absorbed, or reflected by the light shielding layer and may not exert an influence to each other. In this manner, a color mixing between adjacent light emitting cells may be prevented, thereby improving the color reproducibility of the light emitting device.

Also, by disposing light shielding layers on both surfaces of the substrate, the light emitting device including the substrate having a thin thickness may be prevented from being damaged by an external shock.

Moreover, by shielding a portion of a cell area where each light emitting cell is disposed, a light emitting area may be formed to be smaller than the cell area. As such, light passing through the light emitting area and emitted from the light emitting cell may be more concentrated, thereby improving the contrast of the light emitting device.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device comprising:
a substrate having a first surface and a second surface opposing the first surface, the first surface having a concave part extending inside the substrate;
a plurality of light emitting cells spaced apart from each other and disposed on the first surface of the substrate; and
a light shielding layer filling a portion of the concave part and disposed between the plurality of light emitting cells,
wherein a portion of the first surface of the substrate is exposed between adjacent light emitting cells,
wherein a depth of the light shielding layer is ⅓ to ½ of a thickness of the substrate, and wherein a longest width between two sides of the concave part is less than 30 μm.

2. The light emitting device according to claim 1, wherein the light emitting cells are disposed directly on the first surface of the substrate, and at least one of the light emitting cells has a first light emitting part, a second light emitting part, and a third light emitting part vertically stacked one over another.

3. The light emitting device according to claim 1, wherein the light shielding layer includes at least one of Ti, Ni, Al, Ag, Cr, a photoresist, epoxy, PDMS, and a black matrix.

4. A light emitting device comprising:
a substrate having a first surface and a second surface opposing the first surface, the first surface having a concave part extending inside the substrate;
a plurality of light emitting cells spaced apart from each other and disposed on the first surface of the substrate; and
a light shielding layer including a non-conductive layer, filling a portion of the concave part, and disposed between the plurality of light emitting cells,
wherein:
each of the light emitting cells has a flat bottom surface facing the first surface of the substrate;
a top surface of the non-conductive layer of the light shielding layer is coplanar with the bottom surface of each of the light emitting cells;
a depth of the light shielding layer is ⅓ to ½ of a thickness of the substrate; and
a longest width between two sides of the concave part is less than 30 μm.

5. The light emitting device according to claim 1, wherein the concave part has at least one of a V-shaped structure, a polygonal structure in which the first surface of the substrate is opened, and a U shaped structure.

6. The light emitting device according to claim 5, wherein the light shielding layer continuously fills the concave part along an inner sidewall thereof.

7. The light emitting device according to claim 1, wherein the concave part includes a vertical part and a horizontal part crossing each other on the substrate.

8. The light emitting device according to claim 1, wherein:
the plurality of light emitting cells are spaced apart by a predetermined distance; and the substrate has a uniform crystallinity.

9. The light emitting device according to claim 1, wherein the plurality of light emitting cells include a first conductivity-type semiconductor layer, an active layer, a second conductivity-type semiconductor layer, and an ohmic layer.

10. The light emitting device according to claim 9, wherein the plurality of light emitting cells further include a first pad electrically coupled to the first conductivity-type semiconductor layer and a second pad electrically coupled with the ohmic layer.

11. The light emitting device according to claim 9, wherein light generated from the plurality of light emitting cells is configured to be emitted to the outside through the second surface of the substrate.

12. The light emitting device according to claim 1, wherein the concave part is defined by two substantially linear inner side walls, and an angle formed by the two linear inner side walls is in a range of about 40 to about 80 degrees.

* * * * *